US008216433B2

(12) United States Patent
Yonesu

(10) Patent No.: US 8,216,433 B2
(45) Date of Patent: Jul. 10, 2012

(54) PLASMA GENERATOR AND METHOD OF GENERATING PLASMA USING THE SAME

(75) Inventor: Akira Yonesu, Nakagami-gun (JP)

(73) Assignee: University of the Ryukyus, Nakagami-gun, Okinawa (JP)

( * ) Notice: Subject to any disclaimer, the term of this patent is extended or adjusted under 35 U.S.C. 154(b) by 666 days.

(21) Appl. No.: 12/224,750

(22) PCT Filed: Feb. 17, 2007

(86) PCT No.: PCT/JP2007/052893
§ 371 (c)(1),
(2), (4) Date: Mar. 19, 2009

(87) PCT Pub. No.: WO2007/105411
PCT Pub. Date: Sep. 20, 2007

(65) Prior Publication Data
US 2009/0260972 A1    Oct. 22, 2009

(30) Foreign Application Priority Data

Mar. 7, 2006  (JP) .................................. 2006-061673

(51) Int. Cl.
*A62D 3/178*  (2007.01)
*C25B 5/00*  (2006.01)
*B01J 19/08*  (2006.01)
*B01J 19/12*  (2006.01)
*C23C 16/50*  (2006.01)
*C23C 16/511*  (2006.01)

(52) U.S. Cl. ................... 204/157.43; 204/155; 204/156; 204/164; 204/170; 204/178; 422/186.04; 422/186.07; 422/186.13; 422/186.14; 422/186.21; 422/186.26; 118/723 R; 118/723 MW; 118/723 AN

(58) Field of Classification Search ................... 204/155, 204/156, 157.43, 164, 170, 176, 178; 422/186.04, 422/186.07, 186.13, 186.14, 186.21, 186.26; 118/723 R, 723 MW, 723 AN
See application file for complete search history.

(56) References Cited

U.S. PATENT DOCUMENTS

| 4,766,287 | A |   | 8/1988 | Morrisroe et al. |
|---|---|---|---|---|
| 4,902,099 | A | * | 2/1990 | Okamoto et al. ............. 356/316 |
| 6,194,835 | B1 |  | 2/2001 | Liehr |
| 6,340,863 | B1 | * | 1/2002 | Ikeda et al. ............... 315/111.21 |

(Continued)

FOREIGN PATENT DOCUMENTS
JP          64-000699 A      1/1989
(Continued)

*Primary Examiner* — Bruce Bell
(74) *Attorney, Agent, or Firm* — Chapman and Cutler LLP

(57) ABSTRACT

A plasma generator in which the variation of the impedance in the cavity before and after plasma is ignited is less and hardly affected by the shape of the cavity, and the ignitability of the plasma is improved and a method of generating plasma using the plasma generator are provided. The plasma generator comprises a nonconductive gas flow pipe (1) for introducing a gas (9) for generating plasma and discharging it into the atmosphere and a conductive antenna pipe (2) surrounding the gas flow pipe. A microwave (7) is applied to the antenna pipe to change the gas in the gas flow pipe into plasma. The plasma generator is characterized in that a slit (3) with a predetermined length is formed in the antenna pipe (2) along the axial direction of the gas flow pipe. Preferably, the plasma generator is characterized in that the length of the slit is an integral multiple of the half-wave length of the applied microwave.

15 Claims, 14 Drawing Sheets

U.S. PATENT DOCUMENTS

| | | | |
|---|---|---|---|
| 6,525,481 B1 | 2/2003 | Klima et al. | |
| 6,593,507 B2 * | 7/2003 | Ikeda et al. | 588/310 |
| 6,600,084 B2 * | 7/2003 | Ikeda et al. | 588/310 |
| 6,635,997 B2 * | 10/2003 | Ikeda et al. | 315/111.21 |
| 6,650,059 B2 * | 11/2003 | Ikeda et al. | 588/311 |
| 2002/0070669 A1 * | 6/2002 | Ikeda et al. | 315/39.3 |
| 2002/0070670 A1 * | 6/2002 | Ikeda et al. | 315/39.3 |
| 2002/0074946 A1 * | 6/2002 | Ikeda et al. | 315/39.3 |
| 2002/0101162 A1 * | 8/2002 | Ikeda et al. | 315/39.3 |
| 2005/0145178 A1 | 7/2005 | Taguchi et al. | |
| 2007/0176562 A1 | 8/2007 | Takikawa et al. | |
| 2009/0317295 A1 * | 12/2009 | Yonesu et al. | 422/29 |
| 2010/0068880 A1 * | 3/2010 | Hatanaka et al. | 438/627 |
| 2010/0068891 A1 * | 3/2010 | Hatanaka et al. | 438/758 |

FOREIGN PATENT DOCUMENTS

| | | |
|---|---|---|
| JP | 6-197930 A | 7/1994 |
| JP | 2000-515678 A | 11/2000 |
| JP | 2001-274150 A | 10/2001 |
| JP | 2002-515639 A | 5/2002 |
| JP | 2004-154654 A | 6/2004 |
| JP | 2004-158247 A | 6/2004 |
| JP | 2004-172044 A | 6/2004 |
| JP | 2005-150473 A | 6/2005 |
| JP | 2005-191018 A | 7/2005 |
| JP | 2005-238228 A | 9/2005 |
| WO | WO 2005/101927 A1 | 10/2005 |

* cited by examiner (a)

(b)

(c)

PLASMA GENERATOR AND METHOD OF GENERATING PLASMA USING THE SAME

TECHNICAL FIELD

This invention relates to a plasma generator and a method for generating plasma using the same, and in particular, to a plasma generator which makes it possible to generate plasma using microwaves in the air and a method for generating plasma using the same.

BACKGROUND ART

Plasma generated in the air is conventionally used in various industrial fields, such as those dealing with welding of materials having a high melting point, surface cleaning in processes for semiconductor manufacture, improvement of the surface of metal materials and the like, and generation of fine particles. In addition, the application of plasma under ambient pressure has been expanding rapidly, so that plasma is now used in sterilizing processes for medical instruments.

As examples of a method for generating plasma under ambient pressure, generation of plasma using arc discharge and a method for heating a gas using microwaves can be cited. Patent Document 1 discloses a method for generating plasma using arc discharge by applying a high-frequency voltage across electrodes, and in particular, discloses a method for using this plasma to form the tip of a syringe and at the same time carry out a sterilizing process.

Patent Document 1: Japanese Unexamined Patent Publication H6 (1994)-197930

The possibility of electrons and ions generated between electrodes colliding with the electrodes so that the electrodes become of a high temperature and wear out, as well as the possibility of part of the metal material forming the electrodes being released into the plasma so that an impurity gets mixed in with the plasma can be cited as being a problem with arc discharge.

Meanwhile, in methods for heating a gas for plasma supplied in a nonmetal pipe, for example a quartz pipe, using microwaves using a conductor placed around the nonmetal pipe, as shown in Patent Document 2, the microwaves applied to the conductor form an electrical field for excitation which penetrates the pipe, and thus, the gas is heated by the electrical field for excitation, so that it becomes of an ionized state, that is to say, so-called electroless discharge is possible, and the electrodes do not wear, and no impurity gets mixed in.

Patent Document 2: Japanese Unexamined Patent Publication 2004-172044

FIGS. 1(a) to 1(c) schematically show the plasma generator 100 in Patent Document 2. An antenna 105 for exciting a cavity and a loop antenna 106 for detecting an internal electromagnetic field are connected to a cavity 102 in coaxial form which surrounds a quartz pipe 101. An upper center conductor 103 which surrounds the quartz pipe 101 is placed in the top portion of the quartz pipe 101 and a lower center conductor 104 which surrounds the quartz pipe 101 in the same manner is placed in the bottom portion within the cavity 102 in a coaxial form.

FIGS. 1(b) and 1(c) are cross sectional diagrams showing the inside of the cavity 102 in coaxial form in FIG. 1(a), and the upper center conductor 103 is electrically connected to the inner surface of the cavity 102 in coaxial form at the upper end. In addition, an inner conductor 121 and an outer conductor 122 are engaged with a space in between in the lower center conductor 104, as shown in FIG. 1(b), and therefore, a choke structure is formed inside the lower center conductor 104, so that microwaves are prevented from being released to the outside. Furthermore, the lower end of the lower center conductor 104 is electrically connected on the inner surface of the cavity 102 in coaxial form.

Next, the operation of the plasma generator 100 is described. The height on the inside of the cavity 102 in coaxial form is set as a multiple of the half wavelength of the microwaves (in integers), and therefore, the microwaves inputted through the antenna 105 for exciting the cavity resonate inside the cavity 102 in coaxial form so as to form an electrical field for excitation 112 between the upper center conductor 103 and the lower center conductor 104, as shown in FIG. 1(b). The gas 110 which passes through the quartz pipe 101 is converted to plasma under the influence of this electrical field for excitation 112. The distribution of the electrical field is oscillation in TM mode.

When the gas inside the quartz pipe 101 is converted to plasma, the plasma functions in the same manner as a conductor, and thus, the orientation of the electrical field for excitation changes so that it lies in the direction from the inner wall of the cavity 102 in coaxial form to the plasma inside the quartz pipe 101, as shown by 113 in FIG. 1(c), so that the electrical field becomes of a coaxial mode (TEM mode), and subsequently, the electrical field for excitation 113 converts the gas within the quartz pipe 101 to plasma.

The change in the orientation of the electrical field for excitation before and after the ignition of the plasma changes the impedance inside the cavity 102 in coaxial form, so that the resonant frequency changes. In order to cope with this change in the frequency, the frequency of the microwaves is adjusted on the basis of the detection signal from the loop antenna 106 for detection of the internal electromagnetic field in Patent Document 2. In addition, it is suggested that a form which makes the change in the impedance be selected for the cavity.

In methods for creating a gap G between the two conductors placed around the quartz pipe at a distance from each other, as in Patent Document 2, however, the impedance inevitably changes before and after the ignition of the plasma, and thus, adjustment of the frequency of the applied microwaves becomes indispensable, as described above. Therefore, a mechanism for adjusting the frequency is required, making the entire apparatus complicated and raising the cost. In addition, in the case where a method for minimizing the change in the impedance by changing the form of the cavity 102 is adopted (here, Patent Document 2 does not disclose any concrete configuration), the form of the cavity 102 is limited, and it becomes difficult to flexibly cope with various changes, for example when a number of quartz pipes are provided.

DISCLOSURE OF THE INVENTION

Problem to Be Solved by the Invention

An object of the present invention is to solve the above described problems and provide a plasma generator where the impedance within the cavity changes little before and after the ignition of the plasma and the ignition of plasma is improved, and which is not easily affected by the form of the cavity, as well as a method for generating plasma using the same.

Means for Solving Problem

The invention according to a first aspect of the invention provides a plasma generator having a non-conductive gas flow pipe through which a gas for generating plasma is introduced and discharged in the air, and a conductive antenna pipe which surrounds the gas flow pipe, the plasma generator irradiating the antenna pipe with microwaves so that the gas in the gas flow pipe is converted to plasma, characterized in that a slit of a predetermined length is created in the antenna pipe in the direction of the axis of the gas flow pipe.

The invention according to a second aspect of the invention provides the plasma generator according to the first aspect of the invention, characterized in that the slit has an opening on the side on which gas is discharged from the gas flow pipe.

The invention according to a third aspect of the invention provides the plasma generator according to the first aspect of the invention, characterized in that the slit is created inside the antenna pipe.

The invention according to a fourth aspect of the invention provides the plasma generator according to any of the first through third aspects, characterized in that the slit has a portion which protrudes into the slit.

The invention according to a fifth aspect of the invention provides the plasma generator according to any of the first through fourth aspects, characterized in that the antenna pipe is bent toward the gas flow pipe at an end on the side where a gas is discharged from the gas flow pipe.

The invention according to a sixth aspect of the invention provides the plasma generator according to any of the first through fifth aspects, characterized in that the length of the slit is set to a multiple of the half wavelength of microwaves for irradiation in integers.

The invention according to a seventh aspect of the invention provides the plasma generator according to any of the first through sixth aspects, characterized in that at least two slits are provided around the gas flow pipe.

The invention according to an eighth aspect of the invention provides the plasma generator according to any of the first through seventh aspects, characterized in that a number of gas flow pipes are provided, and each gas flow pipe has an antenna pipe.

The invention according to a ninth aspect of the invention provides the plasma generator according to any of the first through eighth aspects, characterized in that the antenna pipe is provided within a waveguide through which microwaves propagate so as to penetrate through the waveguide.

The invention according to a tenth aspect of the invention provides a method for generating plasma using the plasma generator according to any of the first through ninth aspects, characterized by having a plasma igniting step of keeping the air pressure within the gas flow pipe lower than ambient pressure and igniting plasma through irradiation with microwaves, and an ambient pressure step of making the air pressure within the gas flow pipe the same as ambient pressure after the plasma igniting step.

The invention according to an eleventh aspect a the invention provides a method for generating plasma using the plasma generator according to any of the first through ninth aspects, characterized by having a plasma igniting step of supplying a first gas into the gas flow pipe and igniting plasma through irradiation with microwaves; and the step of supplying a second gas which is more difficult to convert to plasma than the first gas together with the first gas after the step of igniting plasma and converting the second gas to plasma.

The invention according to a twelfth aspect of the invention provides the method for generating plasma according to the tenth or eleventh aspects, characterized by having a movement step of moving the gas flow pipe and the antenna pipe relative to each other after the ignition of plasma under ambient pressure so that an end portion of the gas flow pipe on the side where a gas is discharged is closer to an end portion of the antenna pipe on the slit side.

The invention according to a thirteenth aspect of the invention provides the method for generating plasma according to any of the tenth through twelfth, aspects, characterized in that microwaves with which the antenna pipe is irradiated are pulse driven and the idle period of the pulse drive is within an average period during which plasma remains within the gas flow pipe, Effects of the Invention The invention according to the first aspect of the invention makes it possible to concentrate an electrical field for excitation in the slit portion using the slit provided in the antenna pipe, so that the gas which passes through the gas flow pipe can be efficiently converted to plasma in the slit portion. In addition, the electrical field for excitation is always generated in the slit portion before and after the ignition of plasma, and it becomes possible to prevent the impedance from changing before and after the ignition of plasma, unlike in the prior art.

The invention according to the second aspect of the invention makes it possible to form a stable plasma torch which extends from the end of the antenna pipe on the side where the gas flow pipe discharges a gas, because the slit has an opening on the side where the gas flow pipe discharges a gas.

The invention according to the third aspect of the invention makes it possible to generate stable plasma inside the antenna pipe, because the slit is created inside the antenna pipe.

The invention according to the fourth aspect of the invention makes it possible to make the energy of microwaves required to ignite plasma lower, so that the ignition of plasma can be improved, because the slit has a portion which protrudes into the slit.

The invention according to the fifth aspect of the invention makes it possible to generate stable plasma inside the antenna pipe, because the antenna pipe is bent toward the gas flow pipe at the end on the side where the gas flow pipe discharges a gas.

The invention according to the sixth aspect of the invention makes it possible to efficiently concentrate the electrical field for excitation, because the length of the slit in the antenna pipe is set to a multiple of the half wavelength of the microwaves for irradiation (in integers), so that a stable standing wave can be formed in the slit portion.

The invention according to the seventh aspect of the invention makes it possible to generate stable plasma, because at least two slits are provided in the antenna pipe along the outside of the gas flow pipe, and therefore, the electrical field for excitation is concentrated in a number of places around the gas flow pipe, and it becomes possible to convert the gas which passes through the gas flow pipe to plasma in more places. In addition, more stable plasma can be generated even in the case where the cross section of the gas flow pipe is larger.

The invention according to the eighth aspect of the invention makes it possible to generate plasma within a number of gas flow pipes at the same time, because a number of gas flow pipes are provided, and each gas flow pipe has an antenna pipe. In addition, according to the present invention, plasma is generated as a result of concentration of an electrical field for excitation in a slit portion, and therefore, the impedance can be prevented from changing before and after the ignition of plasma, even when a number of gas flow pipes and antennas are provided.

The invention according to the ninth aspect of the invention makes it possible to efficiently supply the energy of microwaves which propagate through the waveguide to the antenna pipe, so that the ignition of plasma can be improved, because an antenna pipe is provided within a waveguide through which microwaves propagate so as to penetrate through the waveguide. In addition, the waveguide is also used as a shielding means for containing the antenna pipe, and therefore, it becomes possible to make the plasma generator compact and reduce the cost of manufacture.

The invention according to the tenth aspect of the invention makes it possible to ignite plasma with only the antenna provided in the gas flow pipe, even in the case where no auxiliary igniting means is provided, because the method for generating plasma using the above described plasma generator is provided with the plasma ignition step of keeping the pressure inside the gas flow pipe lower than the ambient pressure and igniting plasma through irradiation with microwaves, and the ambient pressure step of making the pressure inside the gas flow pipe the same as the ambient pressure after the plasma ignition step, so that the ignition of plasma is excellent. It is possible to generate and maintain stable plasma even under ambient pressure after the ignition of plasma.

The invention according to the eleventh aspect of the invention makes it possible to improve the ignition of plasma using a second gas which is difficult to convert to plasma, because the method for generating plasma using the above described plasma generator is provided with a plasma igniting step of supplying a first gas into the gas flow pipe and igniting plasma through irradiation with microwaves, and the step of supplying a second gas which is more difficult to convert to plasma than the first gas together with the first gas after the plasma igniting step and converting the second gas to plasma.

The invention according to the twelfth aspect of the invention makes it possible to easily lead the plasma generated within the gas flow pipe out of the gas flow pipe, because a movement step of moving the gas flow pipe and the antenna pipe relative to each other after the ignition of plasma under the ambient pressure so that the end portion of the gas flow pipe on the side where a gas is discharged is closer to the end portion of the antenna pipe on the slit side is provided.

The invention according to the thirteenth aspect of the invention makes it possible to adjust the amount of plasma generated through pulse drive and ignite plasma smoothly immediately after the idle period, because the microwaves with which the antenna pipe is irradiated are pulse driven and the idle period of the pulse drive is within the average period during which plasma remains in the gas flow pipe.

Figure 1:
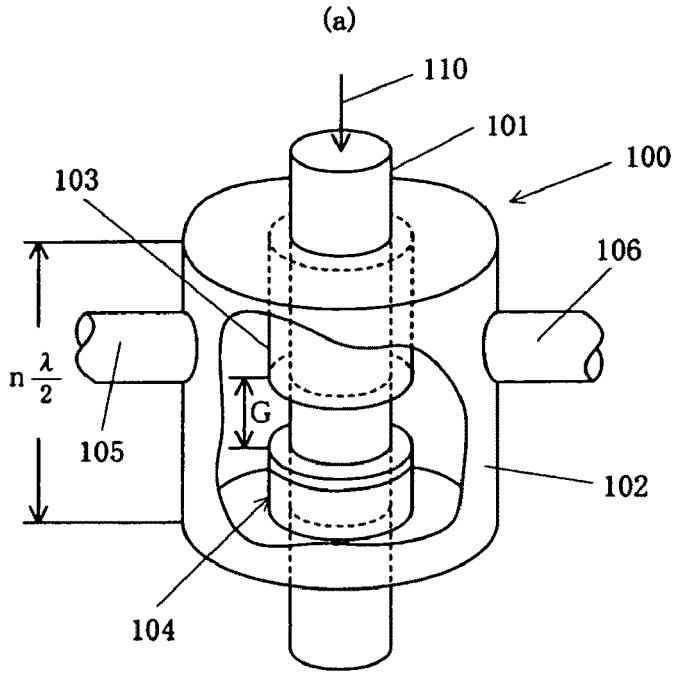
FIGS. 1(a) to 1(c) are diagrams showing a conventional plasma generator.
Figure 1:
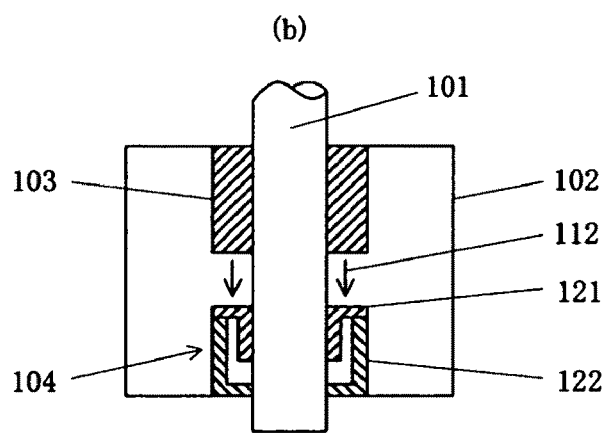
Figure 1:
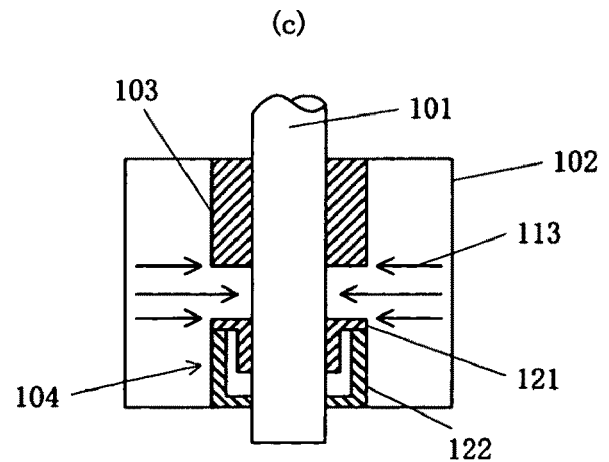

EXPLANATION OF SYMBOLS 1 gas flow pipe
2 antenna pipe
2' sub-antenna pipe
3 slit
4 plasma torch
4' plasma
5, 40 shielding means (cavities)
6 microwave generator
7, 11, 12, 13, 14, 61, 62, 63, 64 microwaves
8, 70, 71 gas supplying source
9, 74 gas
10 microwave intensity adjusting means
20 shield plate
21 container
22 waveguide
23, 24 lids
26 pipe for introducing gas
27 pipe for discharging gas
28 sealing means
30 cap
41 microwave inlet
42, 43 wall surface of shielding means
50 electrode for arc discharge
51 high voltage supply 72, 73 valves
80 pulse waveform of power for emitting microwaves
90 bent portion

BEST MODE FOR CARRYING OUT THE INVENTION

The plasma generator and the method for generating plasma using the same according to the present invention are described in detail below.

(Plasma Generating Portion)

Figure 2:
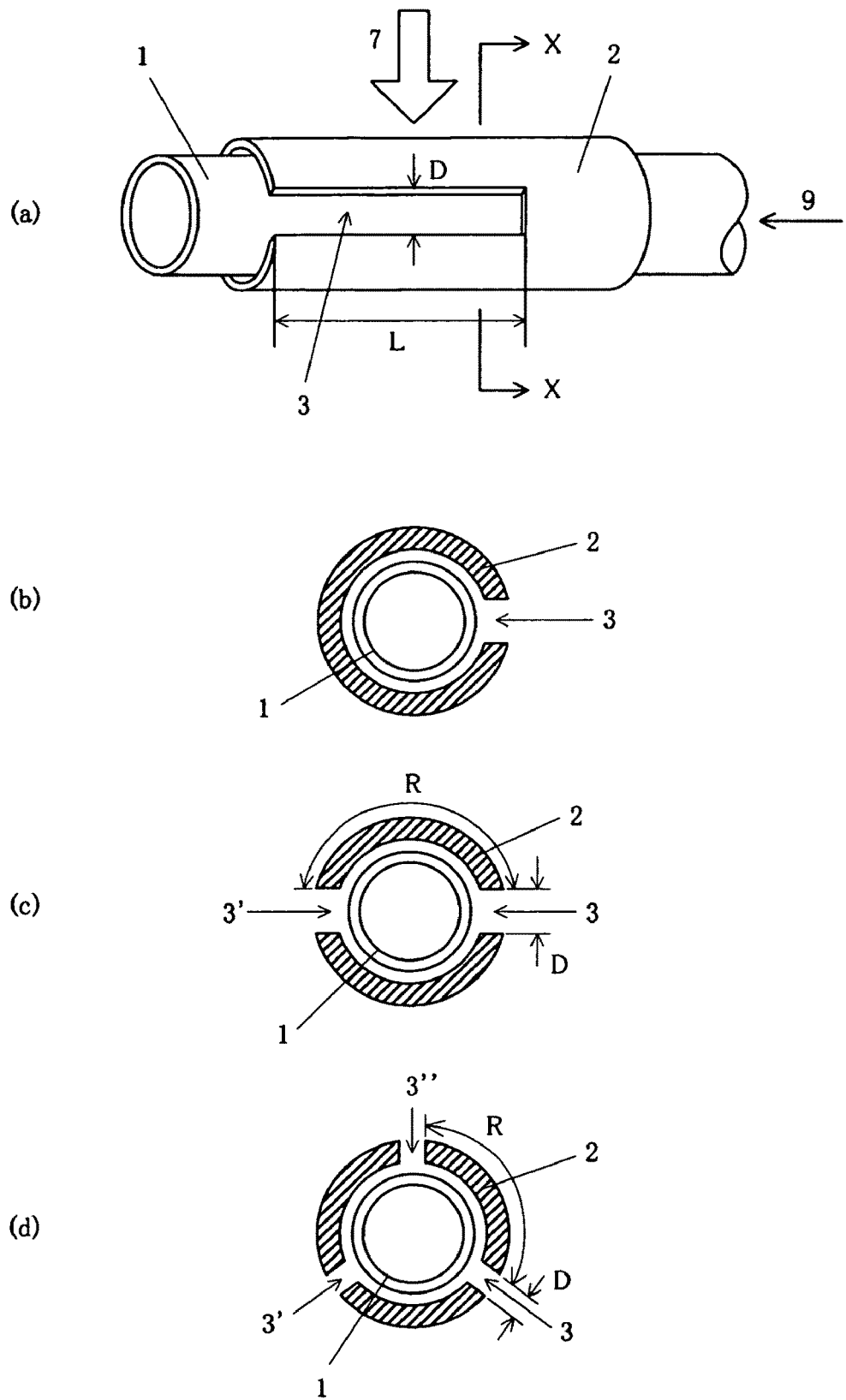
FIGS. 2(a) to 2(d) are diagrams schematically showing the plasma generating portion according to the present invention.

FIG. 2(a) shows the structure of a plasma generating portion used in a plasma generator. The plasma generating portion is formed of a non-conductive gas flow pipe 1, for example a quartz pipe, and a conductive antenna pipe 2, for example an aluminum pipe, and the conductive antenna pipe 2 is provided so as to surround the gas flow pipe 1.

The present invention is characterized in that a slit 3 is created in a conductive antenna pipe 2. This slit portion concentrates the electrical field for excitation of microwaves with which a plasma generation portion is irradiated, and thus, the electrical field makes it possible for plasma to be generated and remain in the gas flow pipe.

As for the form of the slit 3, the length L of the slit portion is set to be a multiple of the half wavelength ($n\lambda/2$; n is an integer of 1 or greater) for the wavelength $\lambda$ of the microwaves with which the plasma generating portion is irradiated. In addition, though the width D of the slit portion is not particularly limited, the smaller the width D is, the stronger the intensity of the electrical for excitation generated in the slit portion becomes, and thus, it becomes possible to accelerate conversion of the gas which passes through the gas flow pipe to plasma, while the region for generating the electrical field for excitation around the gas flow pipe becomes smaller, and therefore, the amount of gas that can be converted to plasma decreases.

Furthermore, it is preferable for the width D of the slit portion to be determined taking the power of the microwaves for irradiation and the insulating properties of the gas in the vicinity of the slit portion into consideration. That is to say, the greater the power of microwaves for irradiation is, the more often breakdown of insulation occurs in the slit portion, causing discharge. Such discharge reduces the intensity of the electrical field for excitation generated within the gas flow pipe and causes wear in the slit portion in the antenna pipe. Therefore, it is necessary to take the power of microwaves for irradiation into consideration so that the width D of the slit portion can be increased to such an extent that there is no breakdown in the insulation. In addition, there is usually a gas which is the same as the air outside the plasma generator in the vicinity of the slit portion, and it is also possible to prevent breakdown in the insulation even when the width D of the slit portion is small by filling the space with a highly insulative gas, such as $SF_6$.

The operation of the plasma generating portion is described below.

A gas 9 to be converted to plasma is introduced into the gas flow pipe 1, and the gas is kept flowing in one direction. When the plasma generating portion is irradiated with microwaves 7 in this state, microwaves form a standing wave, and an electrical field for excitation is concentrated in the slit portion of the antenna pipe 2. The electrical field for excitation penetrates the gas flow pipe so as to heat the gas and generate plasma. The electron temperature of the generated plasma is as high as several tens of thousands of degrees, and the plasma is nonequilibrium plasma of which the ion temperature, or gas temperature, is approximately several tens to several hundreds of degrees. The generated plasma proceeds toward the exit of the glass flow pipe 1 (toward the left in the figure) along with the flow of gas, and specifically, in the case where a slit having the form shown in FIG. 2(a) is used, plasma in torch form (referred to as "plasma torch") is released from the exit of the flow pipe 1 (or the end portion of the antenna pipe 2 where a slit is created).

As for the gas used, it is possible to use various types of gases, such as argon, oxygen, helium and hydrogen, alone or in mixtures, and the necessary gas is selected in accordance with the application for the plasma.

In addition, as described below, a gas which is easy to convert to plasma (first gas) is first introduced into the gas flow pipe in order to improve the ignition of plasma, and after the ignition of plasma, a first gas component is partially replaced with another type of gas (second gas), or the first gas component is gradually replaced with the second gas, and in the final stage, it is possible to generate plasma with only the second gas.

It is possible to change the electron temperature, the gas temperature, the plasma density, the density of the radical gas and the length of the torch (length between the opening of the gas flow pipe or the end portion of the antenna pipe and the end of the plasma torch), which are properties of the plasma torch, by adjusting the power of microwaves with which the plasma generating portion is irradiated, the amount of gas flow and the like.

The number of slits 3 provided in the antenna pipe 2 is not limited to one like in FIG. 2(a). FIG. 2(b) is a cross sectional diagram along arrows X-X in FIG. 2(a), and the antenna pipe 2 is placed coaxially with the gas flow pipe 1, and the cross section of the antenna pipe 2 is in C shape, because of the slit 3.

FIGS. 2(c) and 2(d) are cross sectional diagrams similar to FIG. 2(b) showing another example of an antenna pipe 2, and it is possible to provide a number of slits around the gas flow pipe 1 so that two slits 3 and 3' are provided as in FIG. 2(c), or three slits 3, 3' and 3" are provided as in FIG. 2(d).

Thus, a number of slits may be provided, and an electrical field for excitation can be formed slit, so that it becomes possible to convert the gas that passes through the gas flow pipe to plasma in more places.

As shown in FIGS. 2(c) and 2(d), the relationship between the width D of the slit portions and the length R of the wall of the antenna pipe between slits is extremely important, and it is preferable for the ratio R/D to be 1 or more, so that a stable electrical field for excitation can be concentrated, and it is more preferable for it to be 2 or more. This is because it is necessary for the wall of the antenna pipe to fulfill its function as a grounding electrode satisfactorily between slits. In addition, in order for it to fulfill its function as a grounding electrode satisfactorily for the frequency of the microwaves, it is necessary to take into consideration the distance R between slits, the length L of the slit portions, the thickness d of the pipe wall of the antenna pipe (not shown) and the electrical resistivity $\rho$ of the material that forms the antenna pipe. In addition, these conditions depend on the frequency v of the microwaves with which the antenna pipe is irradiated.

In addition, for the form of the slit portions, it is possible to adopt such a form that the intensity of the electrical field increases in portions where the electrical field is concentrated in the standing wave in the electrical field for excitation formed inside the slits. Concretely, the form of the slits in the direction of the length is not limited to being rectangular, as in FIG. 2(a), and slits are created so as to have a locally narrow width D in order to form a portion on which the electrical field concentrates. The form of the pipe wall in which slits are created in a cross section is not limited to being in C shape, as in FIGS. 2(b) to 2(d), and it is preferable for the form, for example taper form, to allow the electrical field to be concentrated in the end portion in taper form.

In terms of the form and the arrangement of the above described slits, though slits having an opening at the end of the antenna pipe (end portion of gas flow pipe on side where gas is discharged) are illustrated in FIG. 2(a), it is possible to generate a stable plasma torch which extends from the end of the antenna pipe to the side of the gas flow pipe where a gas is discharged in the case where slits are used.

Figure 15:
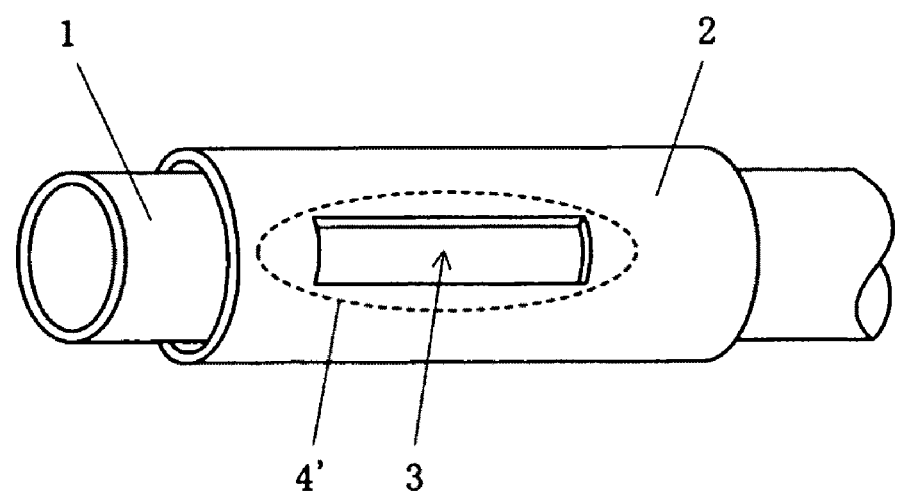
FIG. 15 is a diagram schematically showing a plasma generating portion where a slit is created inside the antenna pipe.

Meanwhile, a slit 3 is created inside the antenna pipe 2, as shown in FIG. 15, in order to generate stable plasma inside the antenna pipe. As a result, it becomes possible to generate plasma 4' inside the gas flow pipe 1 in the vicinity of the slit 3. The plasma torch, which extends from the antenna pipe to the outside through the gas flows pipe, is appropriate for use in the case of direct irradiation with plasma, and it is necessary to secure a sufficient distance between the end of the gas flow pipe and the end of the antenna pipe, and thus, the apparatus becomes large and adjustment of the distance becomes troublesome in the case of no direct irradiation with plasma. It is possible to solve this problem by using the antenna pipe 2 in FIG. 15.

Figure 16:
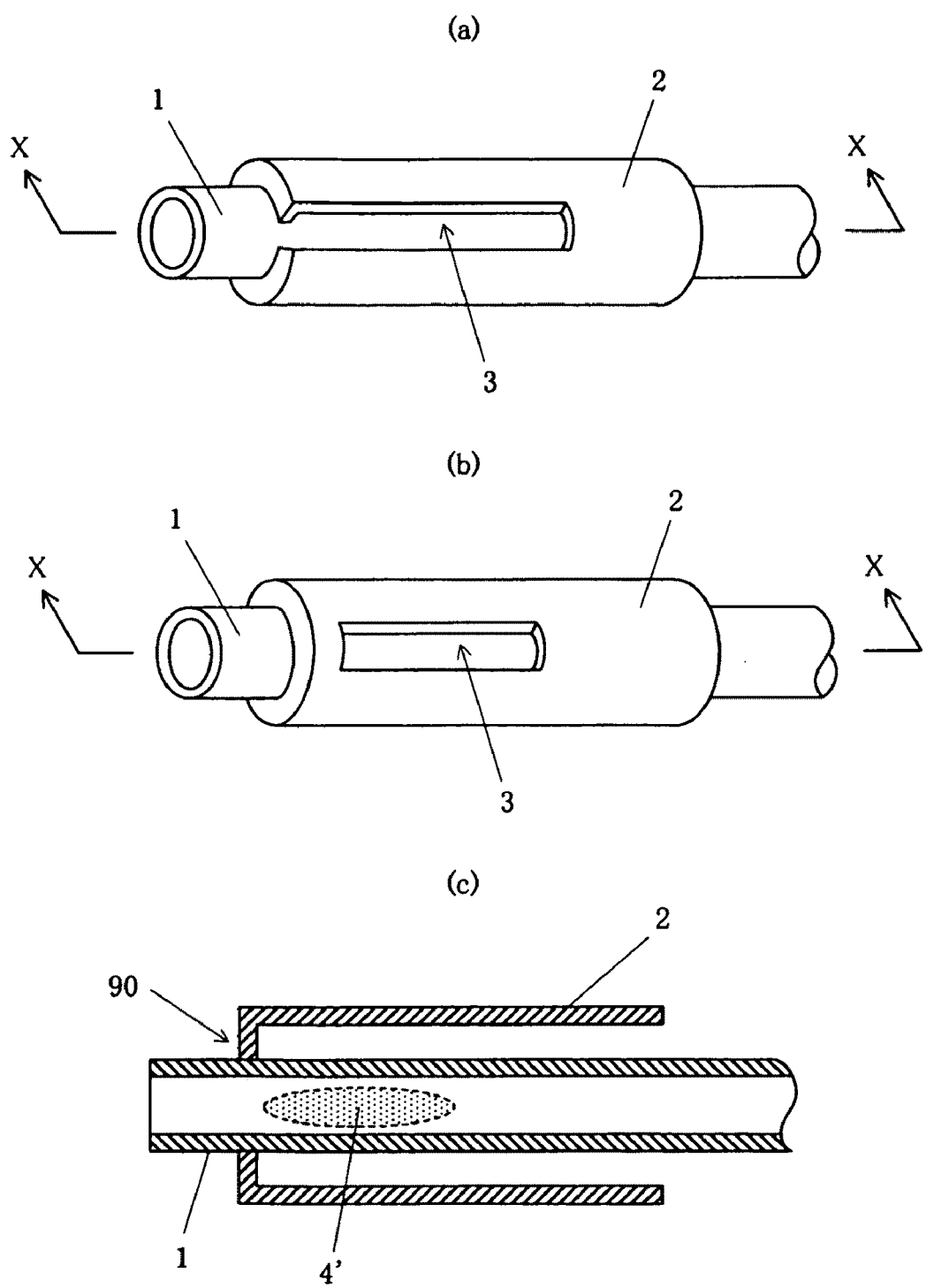
FIG. 16 is a diagram schematically showing a plasma generating portion in the case where an end portion of the antenna pipe is bent.

It is possible to adopt an antenna pipe having the form shown in FIG. 16 in another method for generating plasma inside the antenna pipe. The antenna pipe in FIG. 16(a) has a similar form to that in FIG. 2(a), but the end portion of the antenna pipe 2 (end portion of gas flow pipe 1 on side where gas is discharged) is bent toward the gas flow pipe 1, as in FIG. 16(c), which is a cross sectional diagram along arrows X-X in FIG. 16(a). The bent portion 90 allows plasma 4' to be generated inside the antenna pipe 2, and a plasma torch can be prevented from being generated so as to protrude greatly from the antenna pipe.

Furthermore, the antenna pipe shown in FIG. 16(b) is similar to that in FIG. 15, and a bent portion 90 is formed in the end portion of the antenna pipe 2. The cross sectional diagram along arrows X-X in FIG. 16(b) is similar to that of FIG. 16(c).

As shown in FIGS. 15 and 16(b), plasma can be generated inside the antenna pipe, and in addition, the ignition of plasma can be improved by creating a slit inside the antenna pipe or forming a bent portion in the end portion of the antenna pipe, as found out by the present inventor.

In addition, as concerns the form of the slit in FIGS. 15 and 16(b), a portion which protrudes into the slit is provided in a portion of the slit, as shown in FIG. 23(c), and thus, a portion where an electrical field easily concentrates can be provided, so that the ignition of plasma can be further increased.

Though in the following, mainly an example of a slit having the form shown in FIG. 2(a) is described, the slits shown in FIGS. 15 and 16 can, of course, also be applied.

(Plasma Generator)

Figure 3:
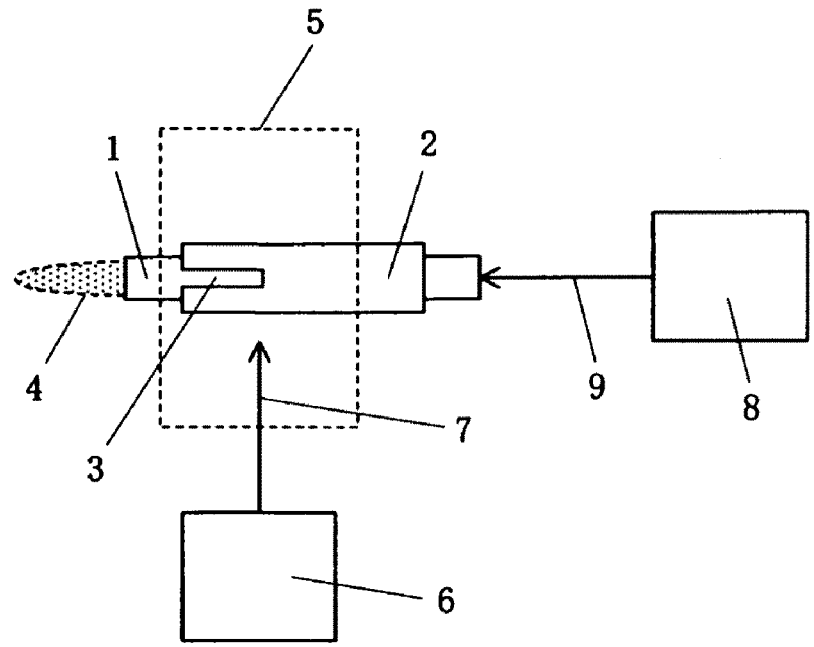
FIG. 3 is a diagram schematically showing the plasma generator according to the present invention.

FIG. 3 is a schematic diagram showing the basic configuration of the plasma generator according to the present invention.

A predetermined amount of a gas 9 is supplied from the gas supplying source 8, for example a gas tank for storing a gas for generating plasma, to the gas flow pipe 1 which forms the plasma generating portion. The antenna pipe 2 surrounding the gas flow pipe 1 is contained in the shielding means 5 for containing microwaves, and one end of the antenna pipe 2 (end portion where no slit 3 is created; two ends in the case where the slit is inside the antenna pipe, as in FIG. 15) is electrically connected to the shielding means 5. The shielding means is a portion which corresponds to the conventional cavity, and in the following, the term "shielding means" includes the cavity.

Microwaves 7 are introduced into the shielding means 5 from the microwave generator 6, so that the antenna pipe 2 is irradiated with microwaves 7. The microwaves form a standing wave in the slits 3 in the antenna pipe 2, so that an electrical field for excitation is generated. The electrical field for excitation converts the gas which passes through the gas flow pipe 1 to plasma and creates a plasma torch 4, which is discharged through the opening of the gas flow pipe 1.

Though the material and the form of the shielding means 5 are not particularly limited, as long as it can contain microwaves, it is preferable to use a container made of stainless steel in order to hold the plasma generating portion within the shielding means and efficiently reflect microwaves.

In addition, it is preferable for the form of the shielding means 5 to make it easy to for microwaves to resonate, in order for the shielding means 5 to efficiently contain microwaves, and it is possible to make a portion of the walls that form the shielding means movable and make the volume and form inside the shielding means adjustable.

Figure 21:
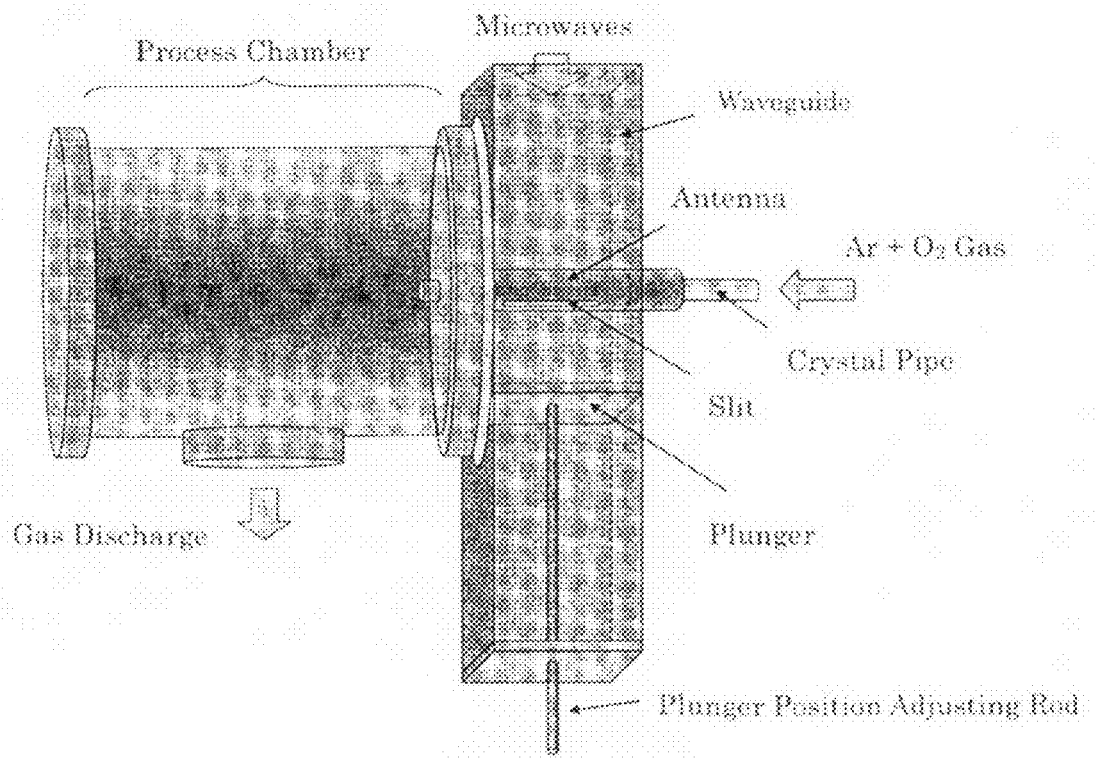
FIG. 21 is a schematic diagram showing the plasma generator used in Example 3.
Figure 22:
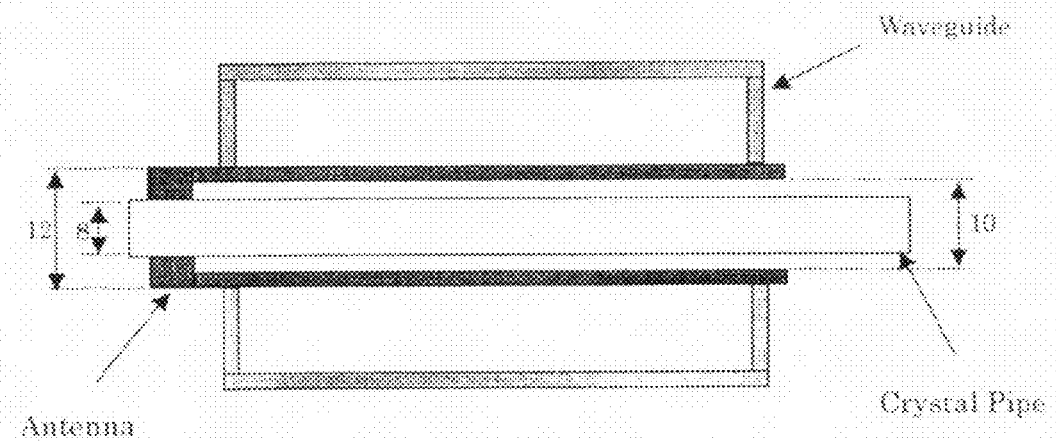
FIG. 22 is a diagram showing how an antenna pipe and a quartz pipe penetrate through a waveguide.

As shown in FIGS. 21 and 22, it is possible to use a waveguide through which microwaves propagate as a shielding means. The antenna pipe is formed so as to penetrate through the waveguide, and the slit in the antenna pipe is located inside the waveguide. Thus, it becomes possible to efficiently supply the energy of microwaves which propagate through the waveguide to the antenna pipe and further improve the ignition of plasma. Here, the waveguide also functions as a shielding means for containing the antenna pipe, and therefore, it becomes possible to make the plasma generator compact and reduce the cost of manufacture.

Figure 4:
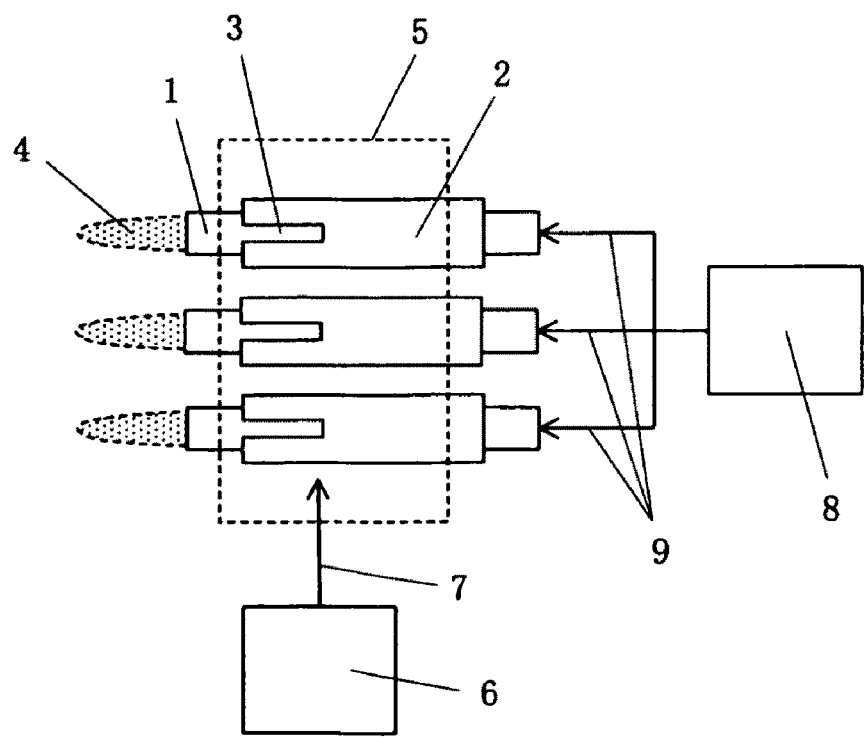
FIG. 4 is a diagram showing a case where the plasma generator according to the present invention has a number of plasma generating portions.

FIG. 4 shows a number of plasma generating portions provided inside the shielding means 5. The present invention is characterized in that it is possible for plasma to be generated and remain inside the respective gas flow pipes, even in the case where a number of plasma generating portions are provided inside the shielding means 5, because plasma is generated by the electrical field for excitation generated in the slits 3 created in the antenna pipes 2. Here, a method for supplying a gas which branches off from the gas supplying source 8 and into each gas flow pipe 1 that forms a plasma generating portion as shown in FIG. 4 is possible, and it is also possible to provide a separate gas supplying source for each gas flow pipe 1.

Figure 5:
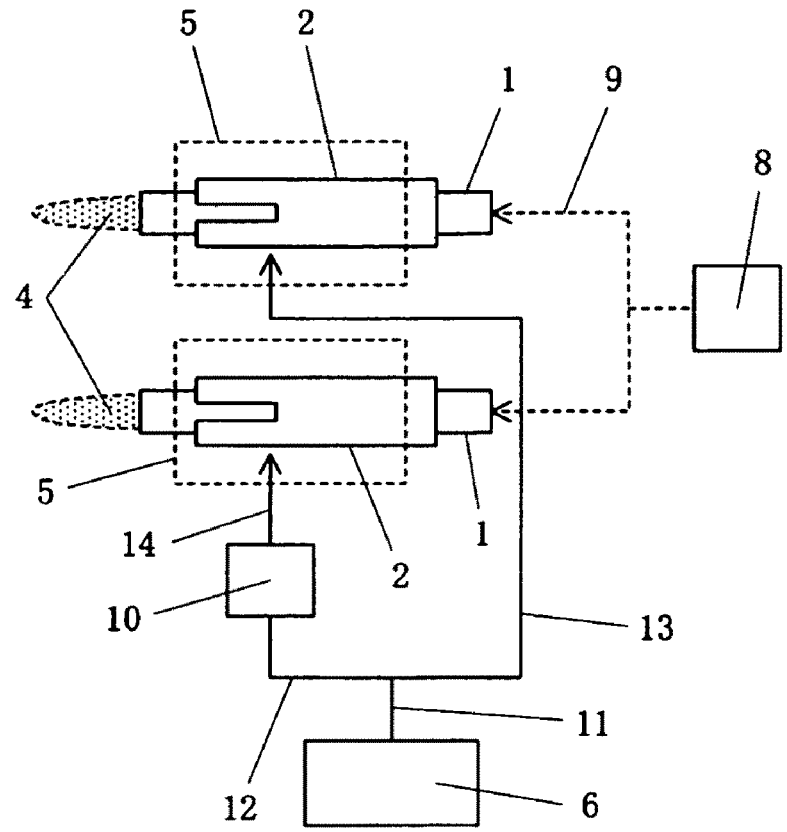
FIG. 5 is a diagram showing a case where a number of plasma generating portions are driven using a single microwave generator in the plasma generator according to the present invention.

In addition, as shown in FIG. 5, it is also possible to provide an individual shielding means 5 for each plasma generating portion. In the case where a number of plasma generating portions are separately provided, or the antenna pipes in the respective plasma generating portions are provided in different directions, microwaves can be better prevented from being lost and plasma can be more efficiently generated when separate shielding means are provided for each generating portion than when a single shielding means surround all of the antenna pipes.

Here, in the case where the antenna pipe penetrates through the waveguide, it is possible to provide separate antenna pipes within the same waveguide and an intensity adjusting means for amplifying and adjusting the intensity of the microwaves in the middle of the waveguide, for example between the antenna pipes or in a branched waveguide.

As a method for supplying microwaves into a number of shielding means 5, though it is possible to provide separate microwave generators for each shielding means, microwaves 11 branch off from a single microwave generator 6, so that the branched microwaves 12 and 13 can be supplied to the respective shielding means 5 in the configuration shown in FIG. 5. Here, in order supply microwaves into the shielding means with optimal intensity, it is possible to provide an intensity adjusting means for adjusting the intensity of the microwaves in a portion of the waveguide through which microwaves propagate in at least one direction. Here, it is, of course, possible to provide an isolator or a tuner between the microwave generator and the shielding means in the plasma generator according to the present invention if necessary.

Figure 6:
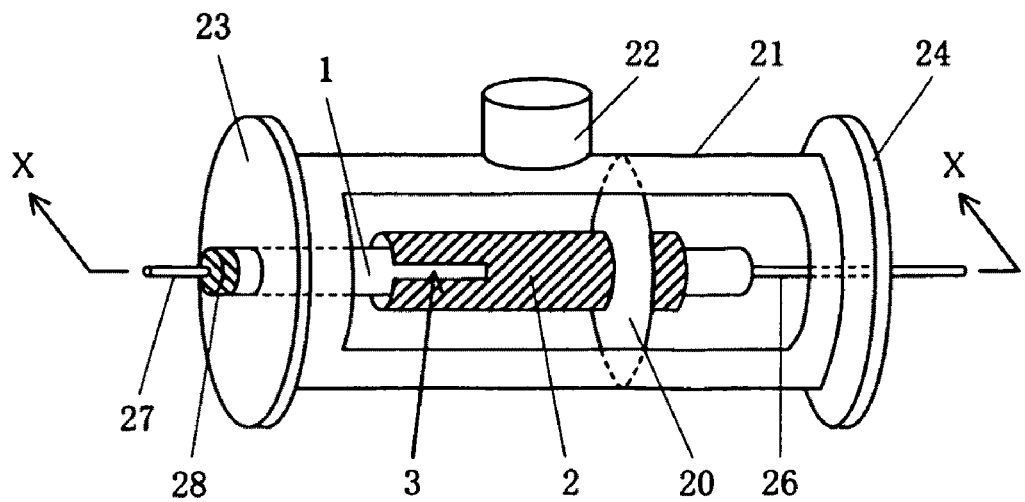
FIG. 6 is a perspective diagram showing an example of the plasma generator according to the present invention.

FIG. 6 is a perspective diagram showing a concrete example of a plasma generator.

In FIG. 6, a cylindrical container 21 made of stainless steel is used as a shielding means, and the two ends of the container 21 are sealed with lids 23 and 24 using a flange or the like. In addition, a waveguide 22 for introducing microwaves is connected to a portion of the container 21. A gas flow pipe 1 and an antenna pipe 2 for forming a plasma generating portion are contained inside the container 21, and the gas flow pipe 1 is provided so as to penetrate through the lids 23 and 24. In addition, a shield plate 20 is provided so as to make contact with the antenna pipe 2 in a portion where no slit is created. The shield plate 20 is provided so as to be movable and adjustable in the direction of the axis of the container 21, so that microwaves introduced into the container 21 can resonate. FIG. 6 is a diagram showing the container 21 with a portion missing so that the inside of the container 21 can be seen.

Figure 8:
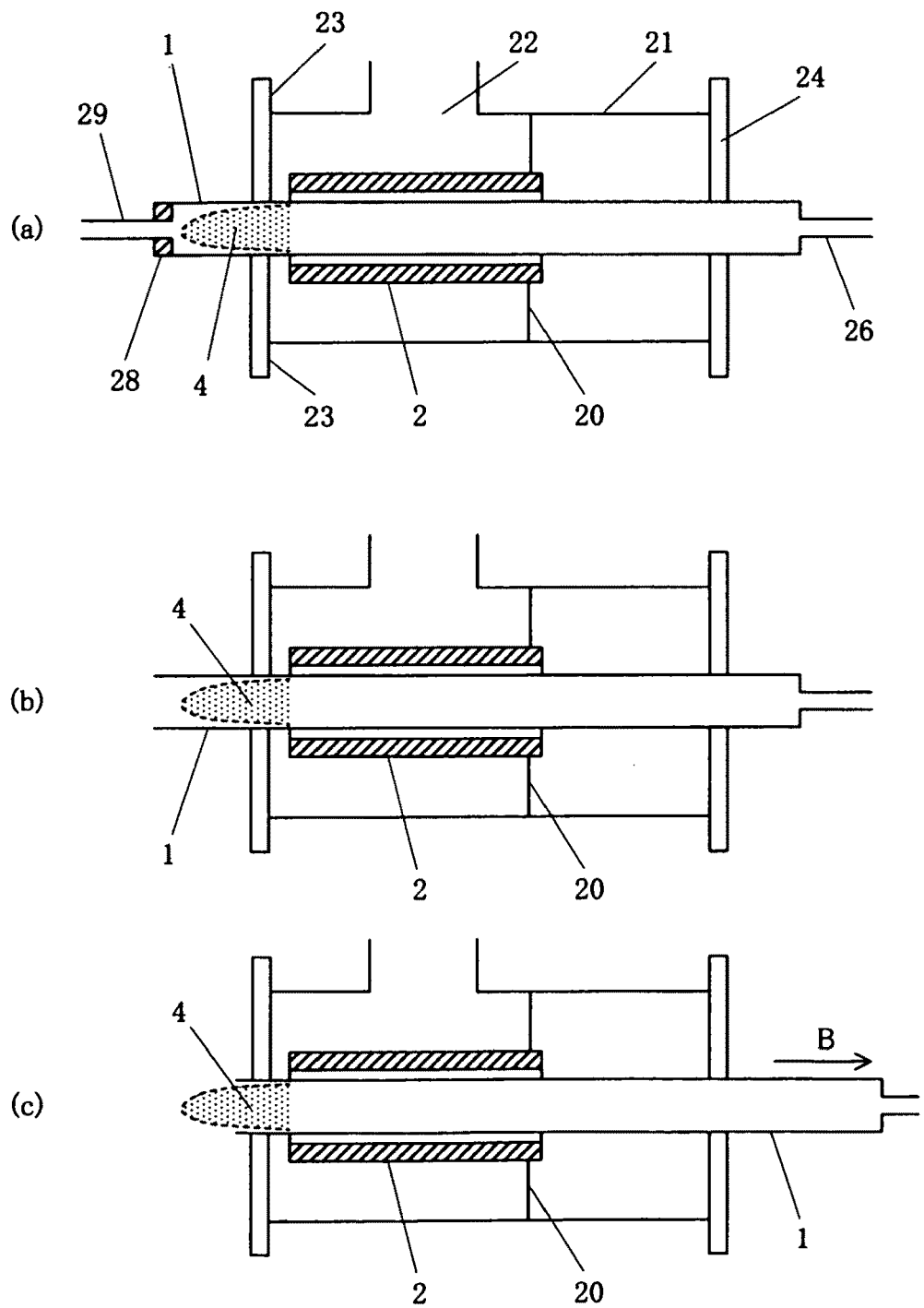
FIGS. 8(a) to 8(c) are diagrams illustrating a method for moving the gas flow pipe when plasma is generated.
Figure 9:
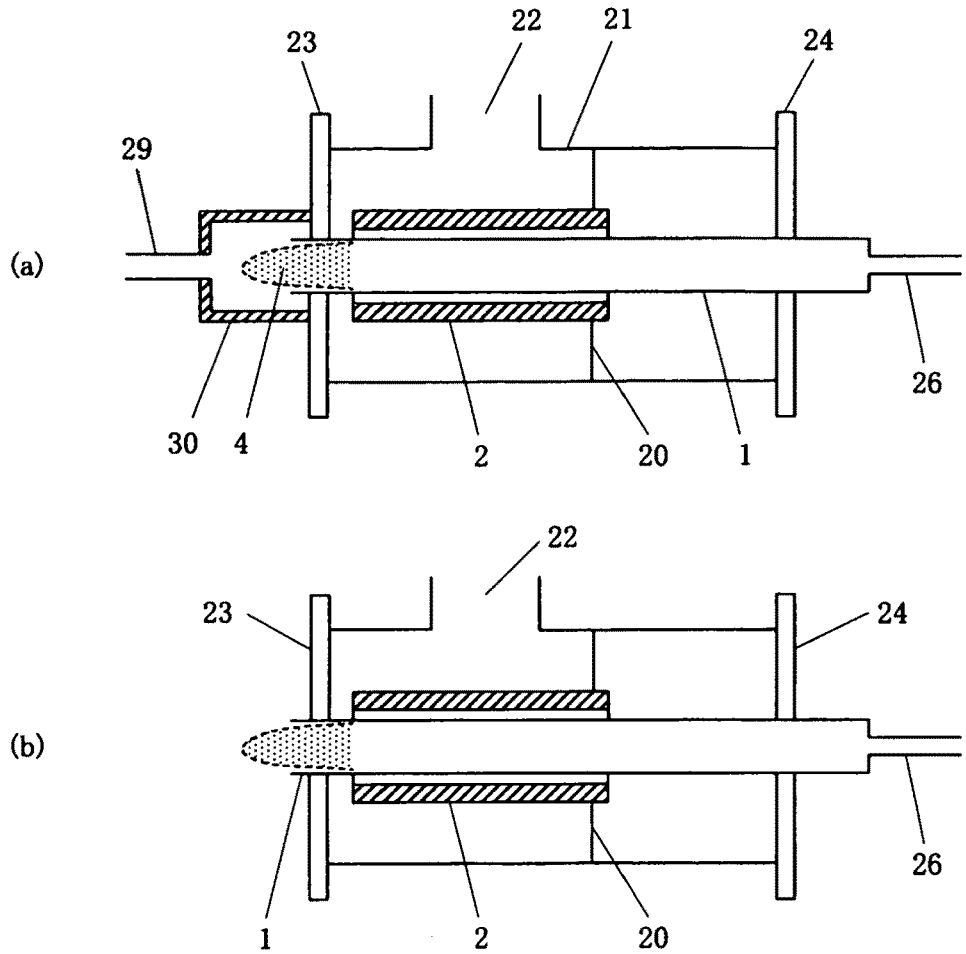
FIGS. 9(a) and 9(b) are diagrams illustrating a method using a metal cap when plasma is generated.

A pipe 26 for introducing a gas is connected to the gas flow pipe 1, so that a gas can be supplied from the gas supplying source, not shown, to the gas flow pipe 1. As shown in FIG. 6, it is possible to connect the gas flow pipe 1 and the pipe 26 for introducing a gas inside the container 21, and in addition, to connect these outside the container 21, as shown in FIGS. 8 and 9, as in the configuration described below.

In addition, a pipe for discharging a gas 27 is connected to the gas flow pipe 1 on the exit side via a sealing means 28, such as of silicone rubber. The other end of the pipe for discharging a gas 27 is connected to a vacuum pump, not shown, and used to set the pressure inside the gas flow pipe 1 to a predetermined pressure. The sealing means 28 and the pipe for discharging a gas 27 are removed from the gas flow pipe 1 after the ignition of plasma, and the pressure inside the gas flow pipe 1 is set the same as the ambient pressure.

Figure 17:
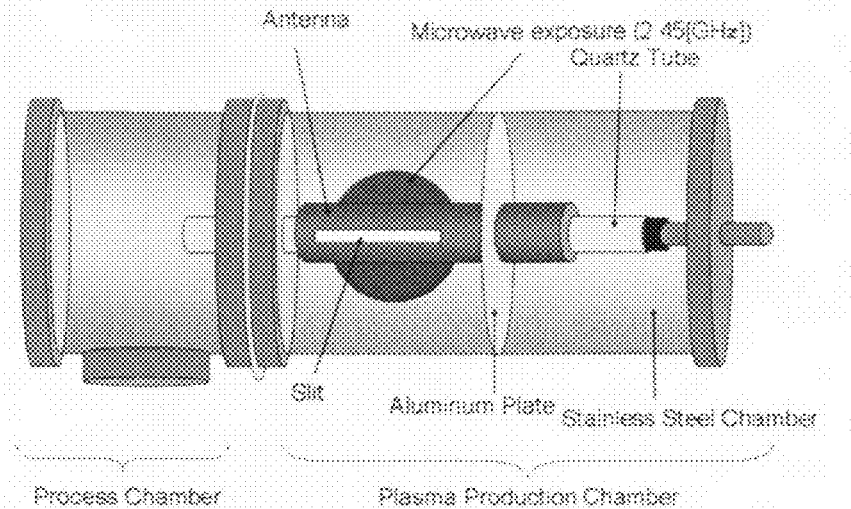
FIG. 17 is a schematic diagram showing the plasma generator used in Example 2.

In addition, it is also possible to omit the sealing means 28 and use the gas flow pipe on the exit side as a processing chamber, as shown in FIGS. 17 and 21, so that a vacuum pump can be connected to the chamber if necessary and the pressure inside the chamber can be changed and adjusted in the configuration.

(Method for Generating Plasma)

Next, a method for generating plasma using the plasma generator of FIG. 6 is described.

Figure 7:
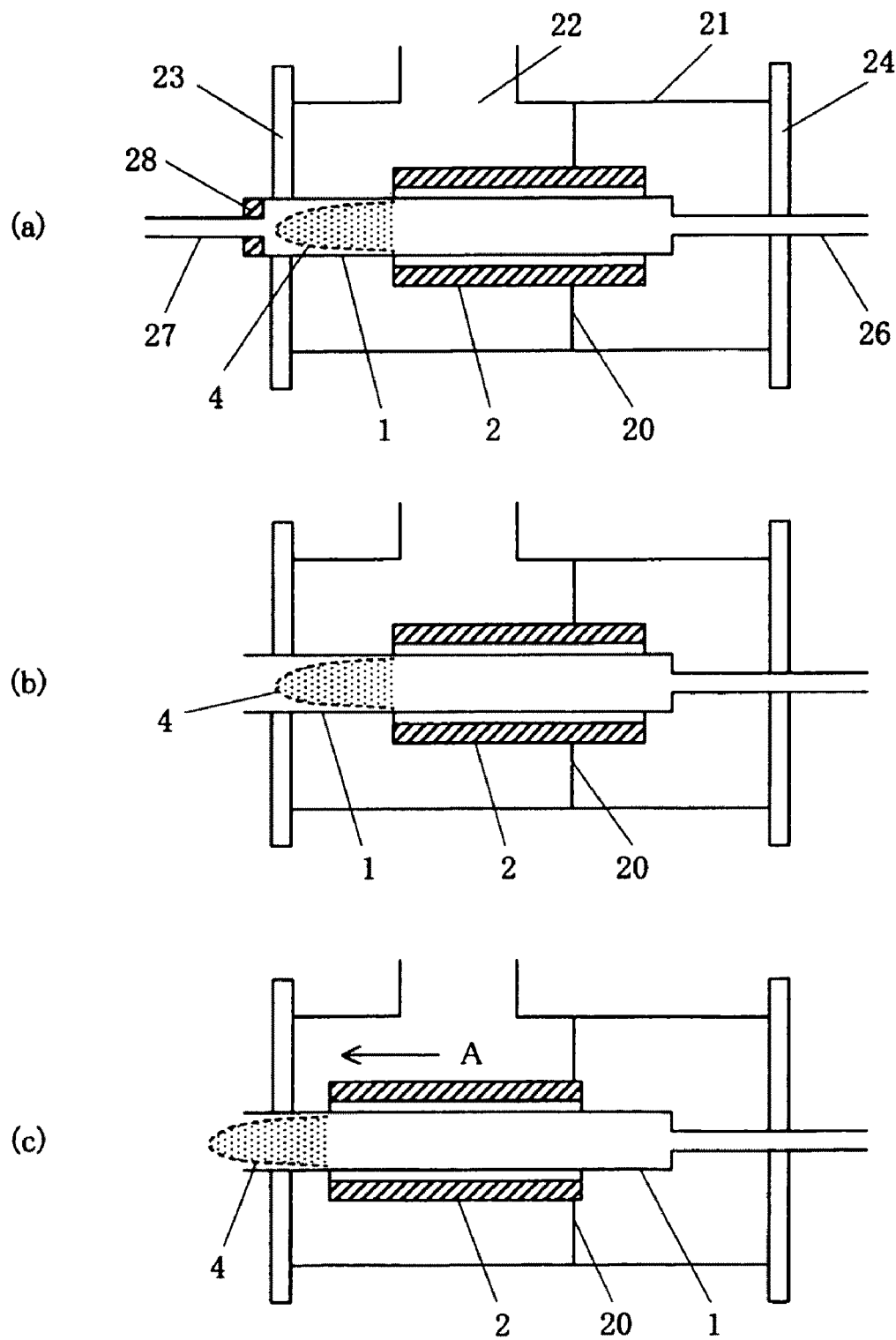
FIGS. 7(a) to 7(c) are cross sectional diagrams showing the plasma generator in FIG. 6 and illustrating a method for moving the antenna pipe when plasma is generated.

FIGS. 7(*a*) to 7(*c*) are cross sectional diagrams along arrows X-X in FIG. 6. First, as shown in FIG. 7(*a*), a sealing means 28 and a pipe for discharging a gas 27 are connected to a gas flow pipe 1 so that the air inside the gas flow pipe 1 is discharged to the outside by a vacuum pump connected to the other end of the pipe for discharging a gas 27. In addition, the vacuum pump is continuously operated so that a predetermined amount of a gas flows through the gas flow pipe 1 from a pipe for introducing a gas 26, and thus, the air pressure within the gas flow pipe 1 is maintained at a pressure which is lower than the ambient pressure (approximately $10^5$ Pa) (approximately $10^2$ Pa to $10^3$ Pa; here, the set pressure varies depending on the frequency and the power of microwaves and the type of gas to be converted to plasma).

Microwaves are introduced through a waveguide 22 so that a plasma torch is generated by the antenna pipe 2. It is possible after the ignition of plasma to slightly move a shield plate 20 if necessary so that the resonant state of the microwaves can be finely adjusted. After the generation of plasma has reached a stable state, as shown in FIG. 7(*b*), the sealing means 28 and the pipe for discharging a gas 27 are removed from the gas flow pipe 1 so that the inside of the gas flow pipe 1 is connected to the ambient atmosphere.

Next, as shown in FIG. 7(*c*), the antenna pipe 2 is moved in the direction of the arrow A so that the plasma torch is lead to the outside through the opening of the gas flow pipe 1. It is not necessary for the plasma torch 4 to be lead to the outside of the gas flow pipe 1, but it is also possible to lead the plasma torch to the outside as shown in FIG. 7(*c*) in accordance with the application where the plasma is used.

FIGS. 8(*a*) to 8(*c*) illustrate a method for leading a plasma torch to the outside of the gas flow pipe 1 by moving the gas flow pipe 1, unlike in FIGS. 7(*a*) to 7(*c*).

FIGS. 8(*a*) to 8(*c*) are cross sectional diagrams showing a plasma generator in the same manner as in FIGS. 7(*a*) to 7(*c*), and FIG. 8(*a*) is a diagram showing the state where plasma is ignited with the inside of the gas flow pipe 1 being maintained in such a state that the pressure is lower than the ambient pressure in the same manner as in FIG. 7(*a*).

After the generation of plasma has reached a stable state, as shown in FIG. 8(*b*), the sealing means 28 and the pipe for discharging a gas 27 are disengaged from the gas flow pipe 1 so that the inside of the gas flow pipe 1 is connected to the ambient atmosphere. In addition, the gas flow pipe 1 is moved in the direction of the arrow B as shown in FIG. 8(*c*) so that the plasma torch 4 is lead to the outside through the opening of the gas flow pipe 1. As shown in FIGS. 7 and 8, it is possible to move the gas flow pipe 1 and the antenna pipe 2 relative to each other, and one or both is moved if necessary so that the plasma torch is lead to the outside of the gas flow pipe.

It is also possible to set the direction of the relative movement between the gas flow pipe and the antenna pipe in FIGS. 7 and 8 opposite in order to lead the plasma torch to the outside of the gas flow pipe as described above, and in addition, in order to contain the plasma torch inside the gas flow pipe or prevent the generated plasma from making contact with the outside air.

FIGS. 9(*a*) and 9(*b*) illustrate a method for leading the plasma torch 4 to the outside of the gas flow pipe 1 using a metal cap 30.

FIGS. 9(*a*) and 9(*b*) are also cross sectional diagrams showing a plasma generator, and as shown in FIG. 9(*a*), a metal cap 30 which makes close contact with the lid 23 or the end portion of the gas flow pipe 1 is provided in the vicinity of the opening of the gas flow pipe 1. The pipe for discharging a gas 29 is connected to the cap 30, and it becomes possible to maintain the inside of the gas flow pipe 1 in such a state that the pressure is lower than the ambient pressure in the same manner as in FIG. 7(*a*) when the vacuum pump connected to the pipe for discharging a gas is operated in such a state that the cap 23 makes contact with the lid 23.

Microwaves are introduced through the waveguide 22 so that plasma is ignited. After the state of plasma is stabilized, as shown in FIG. 9(*b*), the cap is removed and the plasma torch 4 is lead to the outside of the gas flow pipe 1. In accordance with the method of FIGS. 9(*a*) and 9(*b*), it is not necessary to move the gas flow pipe 1 and the antenna pipe 2 relative to each other in order for the movable portions to be as few as possible in the configuration. In addition, it is possible for the cap 30 to be placed in close proximity to the plasma torch, and therefore, it is preferable for the cap 30 to be formed of a material with a high melt point, such as a metal.

Figure 10:
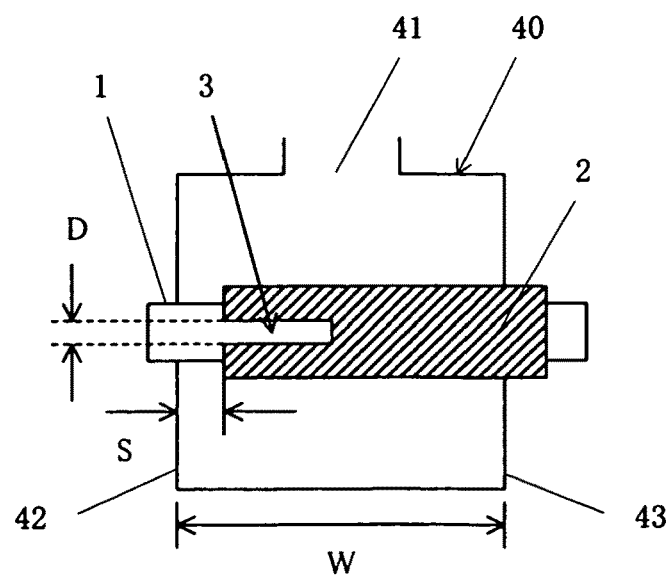
FIG. 10 is a diagram illustrating the positional relationship between the antenna pipe and the shield means.

FIG. 10 is a diagram illustrating the positional relationship between the shielding means 40, which surrounds the plasma generating portion, and the antenna pipe 2.

An opening 41 for introducing microwaves is created in the shielding means 40 which has a wall surface 42 placed in close proximity to the side of the antenna pipe 2 where a slit 3 is located and a wall surface 43 which makes contact with the antenna pipe 2 on the side opposite to the slit 3.

The distance W between the wall surfaces 42 and 43 is set to a predetermined distance so that the microwaves introduced as described above resonate inside the shielding means 40.

In addition, it is preferable for the distance S between the antenna pipe 2 and the wall surface 42 to be set to a distance greater than the width D of the slit because discharge easily occurs between the two when they are close to each other.

(Auxiliary Igniting Means)

Figure 11:
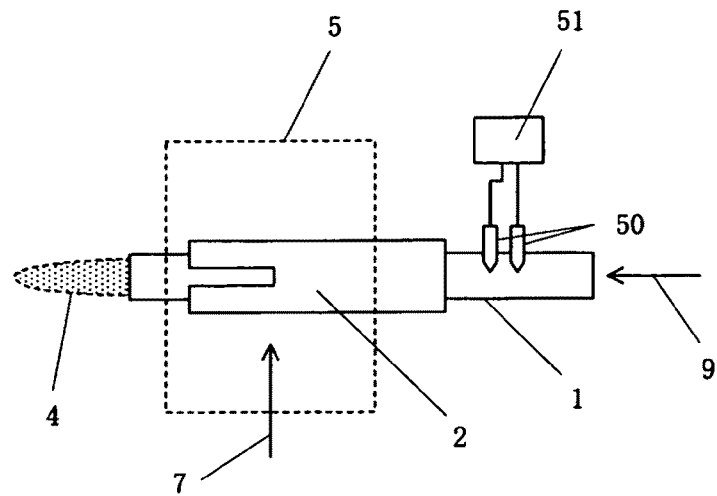
FIG. 11 is a diagram illustrating an auxiliary igniting means using arc discharge.
Figure 12:
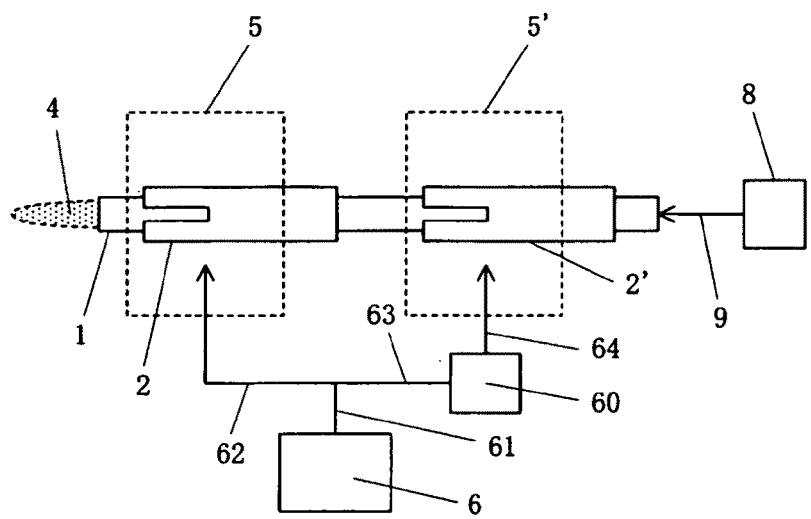
FIG. 12 is a diagram illustrating an auxiliary igniting means using a sub-antenna pipe.

Though methods for easily igniting plasma are described in reference to FIGS. 6 to 9 by maintaining the inside of the gas flow pipe 1 in such a state that the pressure is lower than the ambient pressure at the time of the ignition of plasma, the present invention is not limited to these methods, and it is also possible to combine auxiliary igniting means, for example, an arc discharge means as shown in FIG. 11, and a microwave heating means as shown in FIG. 12 for use. These auxiliary igniting means make it possible to easily ignite plasma in the ambient atmosphere and can make pipes for discharging air and a vacuum pump as described in reference to FIGS. 6 to 9 unnecessary or reduce their roles so that the configuration of the plasma generator can be simplified.

As the arc discharge means, two electrodes 50 are provided so as to protrude into the gas flow pipe 1 as shown in FIG. 11, and arc discharge is made to occur between the two using a high voltage source 51. The gas that has been discharged once is easily converted to plasma through the electrical field for excitation formed by the antenna pipe 2, and therefore, it is not necessary to maintain the inside of the gas flow pipe 1 in such a state that the pressure is lower than the ambient pressure. In addition, it is not necessary for the arc discharge to be a continuous discharge, but may be a discharge in pulses. The arc discharge naturally stops after the plasma has been ignited by the antenna pipe 2.

FIG. 12 illustrates a method for converting a portion of a gas to plasma prior to conversion to plasma by means of the main antenna pipe 2 when a sub-antenna pipe 2' for auxiliary ignition is provided on the upstream side of the gas flow pipe 1.

It is not necessary to provide individual shielding means 5 and 5' so that they surround the antenna pipes 2 and 2' respectively as shown in FIG. 12, and it is also possible for a single shielding means to surround the two pipes together. Here, it is preferable to provide separate shielding means in order to irradiate the respective antenna pipes with appropriate microwaves.

The sub-antenna pipe 2' may be formed in any manner as long as it is possible to convert a portion of the gas which passes through the gas flow pipe to plasma, and for example, the sub-antenna pipe may have a slit of which the width is smaller than the main antenna pipe 2 so that the electrical field for excitation can be locally increased in the configuration. In addition, it is also possible to increase the electrical field for excitation by taking measures such that the diameter of the gas flow pipe 1 is smaller where the sub-antenna pipe 2' is located and the sub-antenna pipe 2' has a diameter which is smaller than that of the main antenna pipe.

In the case where the microwave generator 6 is shared by the two antenna pipes so that microwaves are supplied to the two antenna pipes, as shown in FIG. 12, the microwaves 61 emitted from the microwave generator 6 are branched so that the main antenna pipe 2 is irradiated with the microwaves 62 in one direction. In addition, the microwaves 63 in the other direction are converted to microwaves 64 via a microwave blocking means 60 so that the sub-antenna pipe 2' is irradiated in the configuration. The microwave blocking means 60 guides the microwaves 63 at the time of auxiliary ignition and blocks the microwaves 63 when the auxiliary ignition becomes unnecessary. In addition, it is also possible to provide the waveguide for the branched microwaves with an adjusting means (not shown) for adjusting the intensity of the microwaves if necessary.

Figure 13:
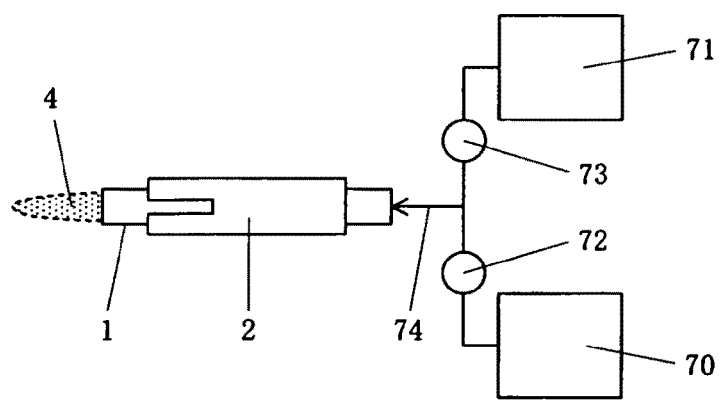
FIG. 13 is a diagram illustrating a method for improving the ignition of plasma using a number of types of gases.

FIG. 13 is a diagram illustrating another method for improving the ignition of plasma which utilizes antenna pipe properties where the energy for converting a gas to plasma is different depending on the type of gas.

70 and 71 indicate gas supply sources for supplying different types of gases, and the supply of each gas is controlled by valves 72 and 73.

First, a gas which can be easily converted to plasma and is inputted in the gas supply source 70 is supplied to the gas flow pipe 1 via the valve 72 in the gas flow 74. Then, the antenna pipe 2 is irradiated with microwaves so that a plasma torch 4 is generated.

Next, the valve 72 is gradually closed, and at the same time, the valve 73 is opened so that the gas supplied to the gas flow pipe 1 is switched from the gas from the gas supply source 70 to the gas from the gas supply source 71. Though the gas supplied from the gas supply source 71 has such properties as to be difficult to convert to plasma, plasma is already generated using the gas from the gas supply source 70, and therefore, it is possible for the gas from the gas supply source 71 to be easily converted to plasma. It is naturally possible to keep supplying both gases from the gas supply sources 70 and 71.

As the gas which can be easily converted to plasma, an argon gas can be cited.

(Pulse Drive of Plasma)

Though it is possible in the plasma generator according to the present invention to adjust the amount of generated plasma by adjusting the output of the microwaves which are supplied to the antenna pipe in the plasma generating portion, it is difficult to generate and maintain plasma unless the output of the microwaves for irradiation is at a certain level or higher in the case where the slit width is not changed. Therefore, it becomes difficult to continuously adjust the amount of generated plasma, and thus, this defect is compensated for by using a pulse drive in accordance with the method for generating plasma of the present invention.

Figure 14:
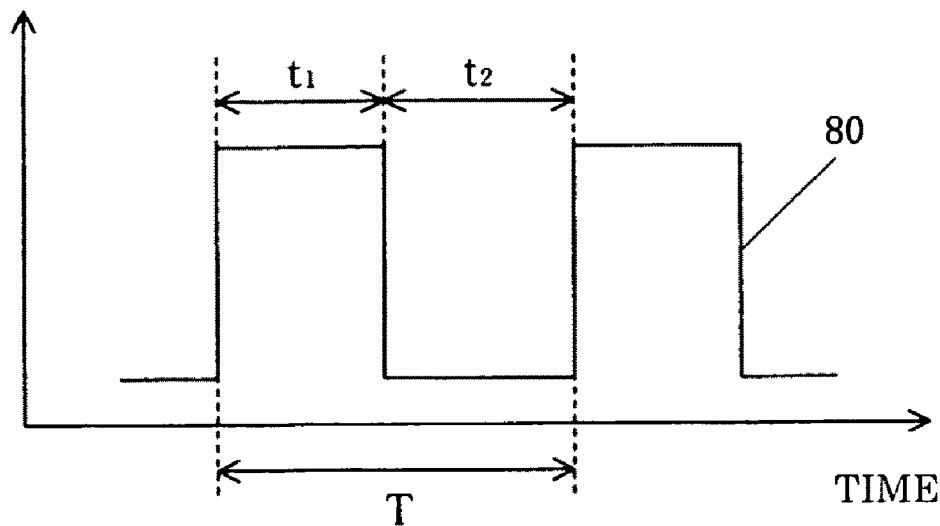
FIG. 14 is a graph illustrating a method for introducing microwaves through pulse drive when generating plasma.

FIG. 14 is a graph schematically showing the change in the power of microwaves generated from the microwave generator, and shows a typical wave form of the drive power which is supplied to the microwave generator. The period T of the pulse drive is made up of an ON period t1 and an OFF period (rest period) t2, and it becomes possible to continuously change the amount of generated plasma by adjusting the duty ratio t1/T of the pulse.

Here, in the case where the rest period t2, which is the period during which plasma is turned off, becomes too long, it becomes difficult to reignite the plasma, and therefore, it is preferable for the rest period t2 to be an average period during which plasma remains in the gas flow pipe in order to implement a stable pulse drive. The average period during which plasma remains in the gas flow pipe means an average value of the time from when plasma is generated to when plasma disappears as a result of contact with the surrounding gas and changes depending on the density of the gas and the kinetic energy of the gas that has been converted to plasma.

EXAMPLE 1

The results of the experiments using the plasma generator according to the present invention are described below.

In the plasma generating portion shown in FIGS. 2(a) to 2(d), a quartz pipe (inner diameter: 20 mm, outer diameter: 22 mm) was used as the gas flow pipe and a pipe made of aluminum (inner diameter: 26 mm, outer diameter: 28 mm) was used as the antenna pipe. A slit having a depth D of 5 mm and a length L of 60 mm was created in the antenna pipe.

The plasma generating portion made up of the antenna pipe and the gas flow pipe was placed inside a chamber having an inner diameter of 160 mm and a length of 1500 mm, which was the shielding means.

The pressure inside the gas flow pipe was reduced to $10^2$ Pa, and at the same time, an argon gas was introduced into the gas flow pipe at a gas flow rate of 10 (l/min), and furthermore, microwaves (frequency: 2.45 GHz) with a power of 600 W for introducing microwaves were introduced into the chamber.

The inside the gas flow pipe was exposed to the ambient pressure ($10^5$ Pa) after the ignition of plasma, and the plasma torch extending from the end of the antenna was observed. The length of the plasma torch was approximately 50 mm, and it was confirmed that the period during which the microwaves were supplied was stable for a constant emission.

EXAMPLE 2

Next, the plasma generator shown in FIG. 17 was used for experiments.

The plasma generator can be roughly divided into two portions where one was a plasma production chamber and the other was a process chamber. It becomes possible to irradiate various objects with radicals by providing a process chamber. The inside of the plasma production chamber was partitioned with shield plates made of aluminum, and the quartz pipe (inner diameter: 10 mm, outer diameter: 30 mm) passed through the center axis so as to extend into the process chamber. Furthermore, the quartz pipe was covered with a cylindrical antenna made of aluminum, and two slits having a length of 60 mm, which corresponds to the half wavelength of the microwaves (width: 5 mm), were provided to the antenna in symmetrical locations (see FIG. 2(c)), and one of these was placed so as to be directed to the inlet for microwaves.

According to an example of the method for generating plasma, air is discharged from inside the quartz pipe and the process chamber using a rotary pump, and after that an argon gas flows through the quartz pipe, so that the gas pressure is kept at 100 Pa to 200 Pa, and then the quartz pipe is irradiated with microwaves (frequency: 2.45 GHz) through the waveguide, so that argon gas plasma is generated. After that, the switching lever for the rotary pump is operated so that the gas pressure rises to the ambient pressure, and thus, nonequilibrium plasma is maintained under the ambient pressure. The plasma generated in the plasma generating portion is blown into the plasma process chamber together with the gas flow.

(Observation of Emission Spectrum of Plasma)

Figure 18:
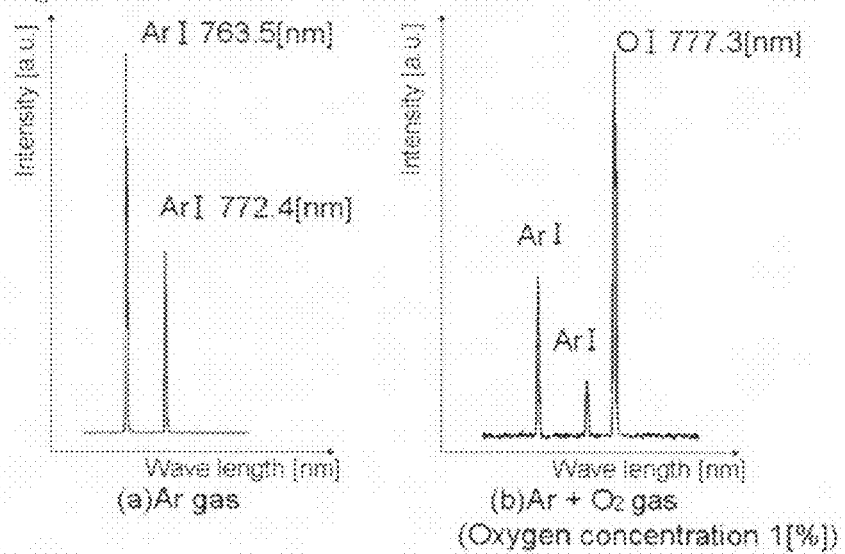
FIG. 18 is a graph showing the distribution in the emission spectrum when plasma is generated.

FIG. 18 shows the emission spectrum in the case where plasma is generated and remains inside the gas flow pipe and only an argon gas is used (FIG. 18(a)), as well as in the case where a mixed gas of argon and oxygen is used (FIG. 18(b)). As for the measurement conditions, the flow rate of the argon gas was 6.0 [l/min] in both cases, and the flow rate of the oxygen gas was 0.07 [l/min] (mixture ratio: approximately 1%) in FIG. 18(b)). In addition, the power for emitting microwaves was 600 W.

In FIG. 18(a), spectrum lines of argon atoms (ArI) were observed at 763.5 nm and 772.4 nm, while in FIG. 18(b), a considerably strong spectrum line of oxygen atoms (OI) was observed at 777.2 nm, in addition to the spectrum lines in FIG. 18(a). In the present apparatus, intense light emission from oxygen atoms was observed, even though the mixture ratio of oxygen was approximately 1%, and this is considered to be because oxygen molecules ionized efficiently, so that there were many oxygen atoms (oxygen radicals) in the plasma.

Figure 19:
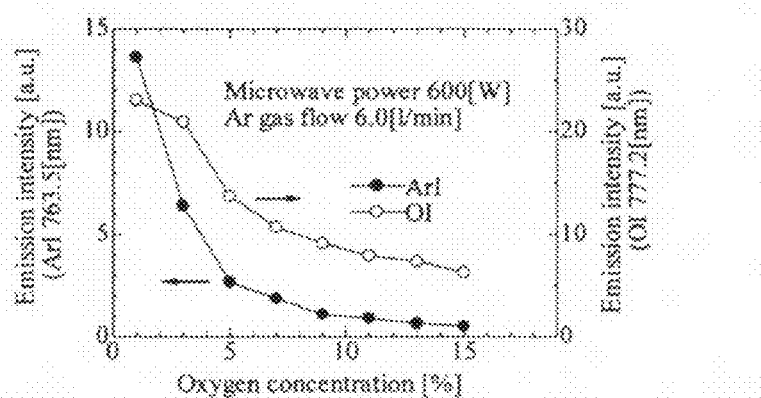
FIG. 19 is a graph showing the change in the intensity of light emitted from plasma against the oxygen gas content in argon gas.
Figure 20:
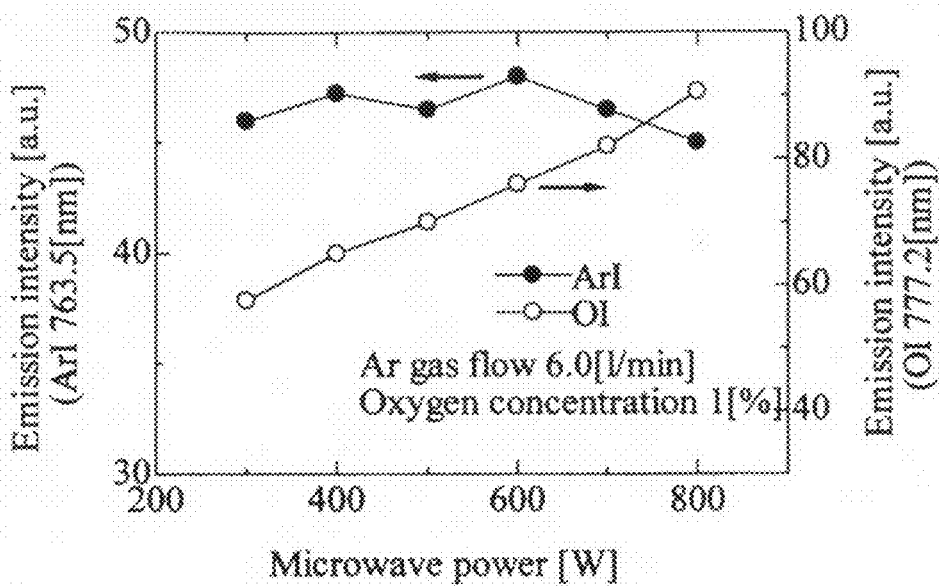
FIG. 20 is a graph showing the change in the intensity of light emitted from plasma against the power of inputted microwaves.

Next, the dependency of the intensity of light emission of ArI (763.5 nm) and OI (777.2 nm) on the mixture ratio of oxygen gas and the power for emitting microwaves was examined. The results are shown in FIG. 19 (dependency on mixture ratio of oxygen gas) and FIG. 20 (dependency on power for emitting microwaves).

In order to examine the dependency on the mixture ratio of oxygen gas, only the flow rate of oxygen gas (oxygen content) was changed with the power for emitting microwaves 600 W and the flow rate of argon gas 6.0 [l/min], and the mixture ratio of oxygen gas was changed within a range of 1% to 15%. It can be seen from FIG. 19 that the light intensity of argon and oxygen atoms both decreased suddenly as the concentration of oxygen increased. It could actually be observed by the eye that the intensity of light emission from the plasma as a whole decreased when an oxygen gas was mixed in. This is considered to be because the energy of the microwaves was used for dissociation of oxygen molecules, in addition to ionization and excitation, when the oxygen was in the form of molecules.

Next, the power for emitting microwaves was changed within a range of 300 W to 800 W with the flow rate of argon gas 6.0 [l/min] and the flow rate of oxygen gas 0.07 [l/min] (mixture ratio of oxygen: approximately 1%), in order to examine the dependency of plasma generation on the power for emitting microwaves. It can be seen from FIG. 20 that the intensity of light emission of argon atoms did not change much, while the intensity of light emission of oxygen atoms increased together with the power for emitting microwaves when the power for emitting microwaves was increased. This is considered to be because the dissociation energy of oxygen molecules is considerably lower than the dissociation energy of argon atoms, and therefore, the extra power for emitting microwaves was consumed for the dissociation of oxygen molecules instead of that of argon atoms.

EXAMPLE 3

Next, experiments were conducted using the plasma generator shown in FIG. 21.

The plasma generator was formed of a process chamber made of stainless steel having an inner diameter of 160 mm and a length of 340 mm, and a waveguide made of aluminum having an inner surface with a height of 54 mm and a width of 109 mm. A quartz pipe having an inner diameter of 6 mm (outer diameter: 8 mm) which penetrates through the waveguide was connected to the process chamber and covered with an antenna having an outer diameter of 12 mm and an inner diameter of 10 mm with two slits. FIG. 22 is a cross sectional diagram showing the relationship between the antenna pipe and the waveguide.

A plunger (aluminum plate) for adjusting the distribution of the electrical field of microwaves was provided inside the waveguide, and the position of the plunger could be adjusted with a plunger position adjusting rod.

In the plasma generator in FIG. 21, plasma is generated through the following process, for example. First, the air inside the process chamber and the quart pipe was discharged using a rotary pump, and after that, an argon gas was injected into the quartz pipe at a gas flow rate of 0.4 (l/min). Next, when microwaves entered the waveguide, an electrical field concentrated in the vicinity of the slits in the antenna, and this electrical field caused discharge, and thus, plasma was generated. After that, the gas pressure was gradually raised to the ambient pressure, and thus, plasma could be generated under the ambient pressure.

Next, in order to find the optimal value for the length of the slits, an antenna pipe which makes it possible to change the length of the slits, as shown in FIG. 23(a), was used. The antenna pipe in FIG. 23(a) was formed of a double pipe: an outer pipe and an inner pipe, and the outer pipe was the same as the above described antenna pipe, except that the length of the slits was 65 mm or longer, and the inner pipe was contained between the outer pipe and the quartz pipe in such a manner as to be movable relative to the outer pipe. Here, the width of the slits of the outer pipe was set to 5 mm.

Figure 24:
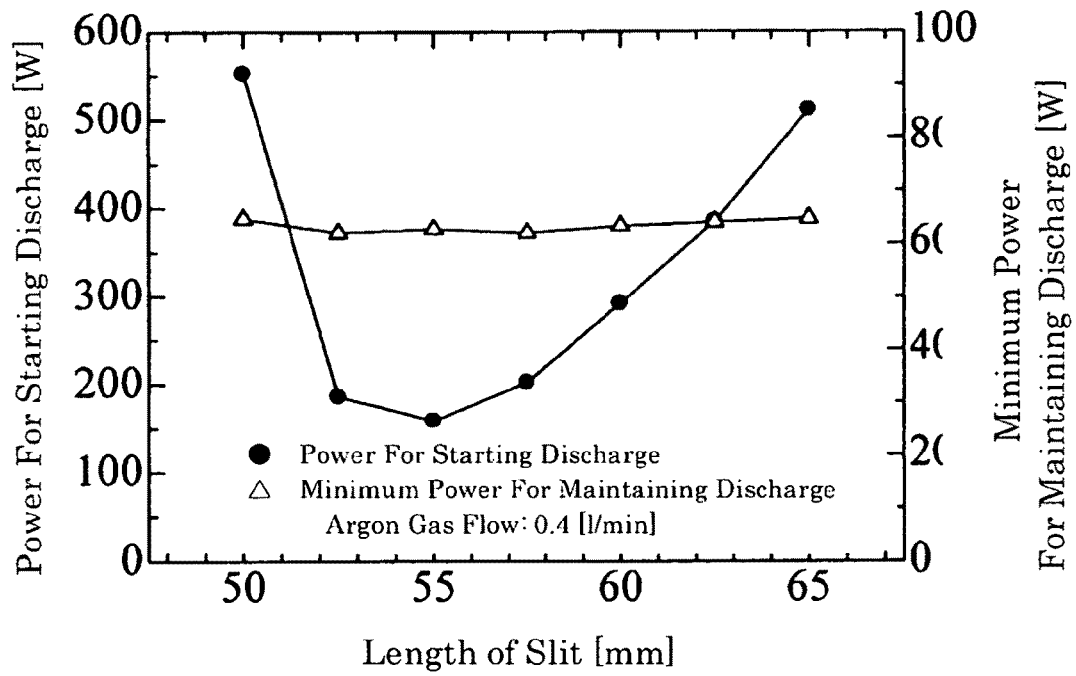
FIG. 24 is a graph showing the change in the power with which discharge starts and the power with which the minimum discharge can be maintained against the length of the slit.

FIG. 24 shows the discharge properties against the length of the slits (discharge starting power, minimum discharge maintaining power). Here, the discharge starting voltage is the power at which discharge of plasma started when the power for emitting microwaves was gradually increased.

It can be seen from FIG. 24 that the lowest discharge starting power was gained when the length of the slits in the antenna pipe in FIG. 23(a) was set to 55 mm. In addition, the minimum discharge maintaining power barely changed.

Figure 23:
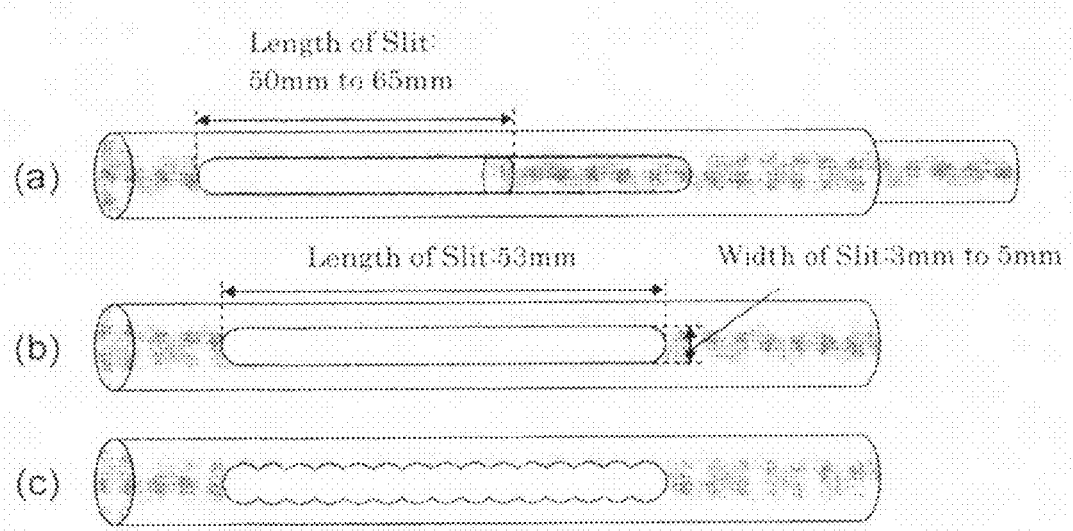
FIG. 23 is a diagram illustrating the difference in form of various types of slits.

Next, the discharge properties of antennas having different widths and slits in different forms having a length of 53 mm were examined. FIG. 23 shows the change in the discharge starting power against the width and the form of the slits.

Figure 25:
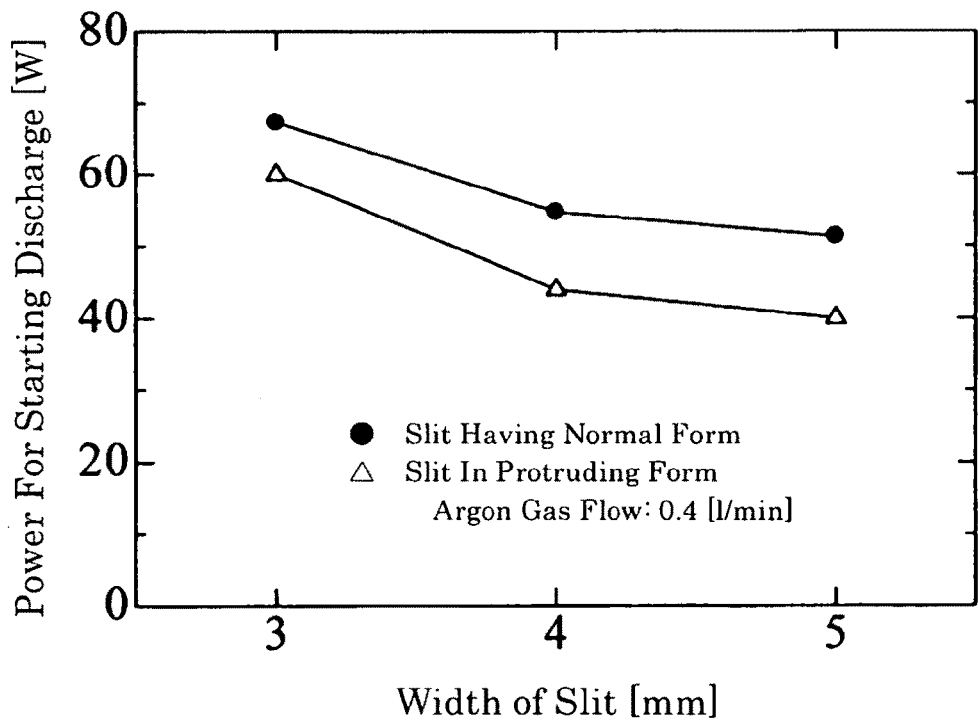
FIG. 25 is a graph showing the change in the power with which discharge starts against the width of the slit and the form of the slit.

It can be seen from the graph for slits in normal form (slits having the form shown in FIG. 23(b)) in FIG. 25 that the discharge starting power was minimum when the width of the slit was 5 mm, which is the greatest within the range explored in the experiments. In addition, it can be seen from the comparison of slits in normal form and slits in protruding form (FIG. 23(c)) that the slits in protruding form had a lower discharge starting voltage. Here, the size for the slits in protruding form having a width of 5 mm in FIG. 25 which makes the discharge starting power the lowest correspond to a case where holes having a diameter of 5 mm were created at intervals of 2 mm and the distance between the facing protrusions was approximately 3 mm.

The reason why the discharge starting power lowered due to the protrusions is considered to be because the properties of microwaves where the electrical field was concentrated on the protrusions, so that the electrical field was more concentrated in the slits in protruding form, and plasma could be generated with lower energy. It can be seen that plasma could be generated with considerably lower power in the case where the antenna pipe penetrated through the waveguide, as in Example 3, compared to in the apparatuses in Examples 1 and 2, where the discharge starting power was approximately 500 W. That is to say, an antenna was provided inside the waveguide, and thus, the apparatus could be miniaturized, and at the same time the efficiency in the generation of plasma increased.

In addition, in order to generate plasma under the ambient pressure, plasma was ignited under low air pressure (approximately 100 Pa), and after that the pressure was gradually raised, and plasma was generated under the ambient pressure in the above described examples. Meanwhile, the optimized antenna in Example 3 succeeded in making it possible to directly ignite plasma of an argon gas under the ambient pressure for a power for emitting microwaves of 500 W.

INDUSTRIAL APPLICABILITY

As described above, according to the present invention, plasma is generated using the electrical field for excitation formed in slit portions provided in the antenna pipe, and therefore, a plasma generator which is not easily affected by the form of the shielding means, where the change in the impedance within the shielding means, for example the cavity, is small before and after the ignition of plasma, and the ignition of plasma is improved, as well as a method for generating plasma using the same, can be provided.

The invention claimed is:

1. A plasma generator, comprising
a non-conductive gas flow pipe through which a gas for generating plasma is introduced and discharged into air, and
a conductive antenna pipe surrounding the gas flow pipe, wherein
the plasma generator irradiates the antenna pipe with microwaves so that the gas in the gas flow pipe is converted to plasma,
the plasma generator comprises a waveguide that has a rectangular cross-sectional shape, and that propagates microwaves generated by a microwave generator,
the antenna pipe is arranged at a part of the waveguide, and penetrates through facing surfaces forming the waveguide, and
a slit of a predetermined length is formed in the antenna pipe inside the waveguide in a direction of an axis of the gas flow pipe.

2. The plasma generator according to claim 1, wherein the slit has an opening formed on a side of the antenna pipe on which gas is discharged from the gas flow pipe.

3. The plasma generator according to claim 1, wherein the slit is formed as an opening in a body of the antenna pipe.

4. The plasma generator according to claim 1, wherein an edge of the slit has a portion which protrudes into an opening of the slit.

5. The plasma generator according to claim 1, wherein the antenna pipe is bent toward the gas flow pipe at an end on a side where gas is discharged from the gas flow pipe.

6. The plasma generator according to claim 1, wherein the length of the slit is set to more than 50 mm and less than 60 mm.

7. The plasma generator according to claim 1, comprising at least two of said slits, said slits being arranged around the gas flow pipe.

8. The plasma generator according to claim 1, comprising a plurality of said gas flow pipes, wherein each gas flow pipe is surrounded by one of said antenna pipes.

9. A method for generating plasma using the plasma generator according to claim 1, comprising the steps of:
a plasma igniting step, comprising keeping air pressure within the gas flow pipe lower than ambient pressure and igniting plasma through irradiation with microwaves; and
making the air pressure within the gas flow pipe the same as ambient pressure after the plasma igniting step.

10. The method for generating plasma according to claim 9, further comprising the step of, after making the air pressure within the gas flow pipe the same as ambient pressure, moving the gas flow pipe and the antenna pipe relative to each other so that an end portion of the gas flow pipe on a side where gas is discharged is closer to an end portion of the antenna pipe on a side where the slit is formed.

11. The method for generating plasma according to claim 10, wherein the microwaves with which the antenna pipe is irradiated are pulse driven, and an idle period of a pulse drive is within an average period during which plasma remains within the gas flow pipe.

12. The method for generating plasma according to claim 9, wherein the microwaves with which the antenna pipe is irradiated are pulse driven, and an idle period of a pulse drive is within an average period during which plasma remains within the gas flow pipe.

13. A method for generating plasma using the plasma generator according to claim 1, comprising the steps of:
 a first plasma igniting step, comprising supplying a first gas into the gas flow pipe and igniting plasma through irradiation with microwaves; and
 supplying a second gas into the gas flow pipe, said second gas being more difficult to convert to plasma than the first gas, together with the first gas after the first plasma igniting step, and converting the second gas to plasma.

14. The method for generating plasma according to claim 13, further comprising the step of, after making the air pressure within the gas flow pipe the same as ambient pressure, moving the gas flow pipe and the antenna pipe relative to each other so that an end portion of the gas flow pipe on a side where gas is discharged is closer to an end portion of the antenna pipe on a side where the slit is formed.

15. The method for generating plasma according to claim 13, wherein the microwaves with which the antenna pipe is irradiated are pulse driven, and an idle period of a pulse drive is within an average period during which plasma remains within the gas flow pipe.

* * * * *